(12) United States Patent
Wu et al.

(10) Patent No.: US 8,809,783 B2
(45) Date of Patent: Aug. 19, 2014

(54) HIGH SPATIAL RESOLUTION NON-CONTACT TEMPERATURE MEASUREMENT

(71) Applicant: Rensselaer Polytechnic Institute, Troy, NY (US)

(72) Inventors: Xiaowei Wu, Troy, NY (US); Robert Hull, Ballston Spa, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 0 days.

(21) Appl. No.: 13/920,868

(22) Filed: Jun. 18, 2013

(65) Prior Publication Data

US 2013/0340127 A1   Dec. 19, 2013

Related U.S. Application Data

(60) Provisional application No. 61/690,110, filed on Jun. 19, 2012.

(51) Int. Cl.
   *G01K 9/00* (2006.01)
   *G01K 11/30* (2006.01)

(52) U.S. Cl.
   CPC . *G01K 11/30* (2013.01); *G01K 9/00* (2013.01)
   USPC .......................................... 250/310; 250/305

(58) Field of Classification Search
   CPC .................................. G01K 11/30; G01K 9/00
   USPC .................................................. 250/305, 310
   See application file for complete search history.

(56) References Cited

U.S. PATENT DOCUMENTS

| | | | |
|---|---|---|---|
| 4,179,604 A * | 12/1979 | Christou | 250/305 |
| 6,573,498 B1 * | 6/2003 | Rangarajan et al. | 850/9 |
| 6,996,492 B1 * | 2/2006 | Testoni | 702/134 |
| 7,253,418 B2 * | 8/2007 | Moses et al. | 250/440.11 |
| 2013/0340127 A1 * | 12/2013 | Wu et al. | 850/50 |

OTHER PUBLICATIONS

Allison et al., "Nanoscale thermometry via the fluorescence of YAG:Ce phosphor particles: measurements from 7 to 77° C.",*Nanotechnology*,14: 859-863, Jun. 11, 2003.
Betzig, Trautman, "Near-Field Optics: Microscopy, Spectroscopy, and Surface Modification Beyond the Diffraction Limit", *Science*, 257(5067): 189-195, Jul. 10, 1992.
Brintlinger et al., "Electron Thermal Microscopy", *Nano Letters*, 8(2): 582-585, 2008.
Brites et al., "A Luminescent Molecular Thermometer for Long-Term Absolute Temperature Measurements at the Nanoscale", *Advanced Materials*, 22: 4499-4504, 2010.
Cahill et al., "Nanoscale thermal transport", *Journal of Applied Physics*, 93(2): 793-818, Jan. 15, 2003.
Cahill et al., "Thermometry and Thermal Transport in Micro/Nanoscale Solid-State Devices and Structures", *Journal of Heat Transfer*, 124: 223-241, Apr. 2002.

(Continued)

*Primary Examiner* — David A Vanore
(74) *Attorney, Agent, or Firm* — Saliwanchik, Lloyd & Eisenschenk

(57) ABSTRACT

Systems, methods, and computer-readable media for temperature measurement of a sample, using new temperature measurement and mapping techniques, are provided. The technique employs a temperature sensitive electron signal in a scanning electron microscope (SEM) and provides both high spatial resolution and non-contact temperature measurement capabilities. An electron beam of the SEM can be initiated to interact with a sample, and a temperature sensitive signal can be collected from the sample and analyzed.

20 Claims, 11 Drawing Sheets

(56) References Cited

OTHER PUBLICATIONS

Cannaerts et al., "Mapping nanometre-scale temperature gradients in patterned cobalt—nickel silicide films", *Nanotechnology*, 13: 149-152, Feb. 11, 2002.
Csendes et al., "Thermal Mapping with Liquid Crystal Method", *Microelectronic Engineering*, 31: 281-290, 1996.
De Wilde et al., "Thermal radiation scanning tunnelling microscopy", *Nature*, 444: 740-743, 2006.
Fergason, "Liquid Crystals in Nondestructive Testing", *Applied Optics*, 7(9): 1729-1738, Apr. 18, 1968.
Fiege et al., "Failure analysis of integrated devices by Scanning Thermal Microscopy (SThM)", *Microelectronics Reliability*, 38: 957-961, 1998.
Field, "Improving the Spatial Resolution of EBSD", *Microscopy and Microanalysis*, 11(2): 52-53, 2005.
Gao, Peng, "Parameterization of the temperature dependence of the Debye-Waller factors", *Acta Crystallographica Section A*, 55: 926-932, 1999.
He, Hull, "Quantification of electron—phonon scattering for determination of temperature variations at high spatial resolution in the transmission electron microscope", *Nanotechnology*, vol. 23, Apr. 30, 2012.
Igeta et al., "Thermal Characteristics of Submicron Vias Studied by Scanning Joule Expansion Microscopy", *IEEE Electron Device Letters*, 21(5): 224-226, May 2000.
Kalinin, Balke, "Local Electrochemical Functionality in Energy Storage Materials and Devices by Scanning Probe Microscopies: Status and Perspectives", *Advanced Materials*, 22: E193-E209, 2010.
Kawamoto et al., "Local temperature measurements on nanoscale materials using a movable nanothermocouple assembled in a transmission electron microscope", *Nanotechnolgy*, vol. 22, Nov. 9, 2011.
Liu, Yang, "Thermography techniques for integrated circuits and semiconductor devices", *Sensor Review*, 27(4): 298-309, 2007.
Luo et al., "Scanning thermal microscopy of a vertical-cavity surface-emitting laser", *Applied Physics Letters*, 71(12): 1604-1606, Sep. 22, 1997.
Majumdar, "Thermal Microscopy and Heat Generation in Electronic Devices", *Microelectronics Reliability*, 38(4): 559-565, 1998.
Majumdar et al., "Thermal imaging using the atomic force microscope", *Applied Physics Letters*, 62(20): 2501-2503, Feb. 18, 1993.
Meola, Carlomagno, "Recent advances in the use of infrared thermography", *Measurement Science and Technology*, 15: R27-R58, Jul. 23, 2004.
Nakayama et al., "Tunable nanowire nonlinear optical probe", *Nature*, 447: 1098-1101, Jun. 28, 2007.
Peng, "Electron atomic scattering factors and scattering potentials of crystals", *Micron*, 30: 625-648, Mar. 22, 1999.
Phillpot, McGaughey, "Introduction to thermal transport", *Materials Today*, 8: 18-20, Jun. 2005.
Shi et al., "Design and Batch Fabrication of Probes for Sub-100 nm Scanning Thermal Microscopy", *Journal of Microelectromechanical Systems*, 10(3): 370-378, Sep. 2001.
Suh, Zenobi, "Improved Probes for Scanning Near-field Optical Microscopy", *Advanced Materials*, 12(15): 1139-1141, Aug. 2, 2000.
Williams, Wickramasinghe, "Scanning Thermal Profiler", *Applied Physics Letters*, 49: 509-513, 1986.
Wu, Hull, "The material dependence of temperature measurement resolution in thermal scanning electron microscopy", *Applied Physics Letters*, vol. 102, 2013.
Wu, Hull, "A novel nano-scale non-contact temperature measurement technique for crystalline materials", *Nanotechnology*, vol. 23, Oct. 12, 2012.
Zaefferer, "On the formation mechanisms, spatial resolution and intensity of backscatter Kikuchi patterns", *Ultramicroscopy*, 107: 254-266, 2007.

* cited by examiner

HIGH SPATIAL RESOLUTION NON-CONTACT TEMPERATURE MEASUREMENT

CROSS-REFERENCE TO RELATED APPLICATION

The present application claims the benefit of U.S. Provisional Application Ser. No. 61/690,110, filed Jun. 19, 2012, which is hereby incorporated by reference herein in its entirety, including any figures, tables, and drawings.

GOVERNMENT SUPPORT

This invention was made with government support under Contract No. C090113 and Contract No. C080117 awarded by NYSTAR, and Contract No. 70NANB12H107 awarded by NIST. The government has certain rights in the invention.

BACKGROUND

Temperature measurement is important to studies of heat generation and transfer processes in a wide range of engineering systems. However, the feature sizes of many engineering systems, such as microelectronic, optoelectronic, and micromechanical systems, have been reduced down to length scales as small as tens of nanometers and continue to decrease. Experimental studies of the nano-scale thermal processes involved in such systems are not possible without high spatial resolution temperature measurement techniques.

Such existing techniques can be grouped into three categories—scanning probe based temperature mapping techniques, optical temperature mapping techniques, and thin coating methods. Scanning probe based techniques, such as scanning thermal microscopy (SThM), are techniques which employ a temperature sensing scanning probe microscopy (SPM) tip to scan across the sample while the temperature signal is collected to form a thermal image. Although SThM can achieve lateral resolution on the order of 50 nm, probing the sample by SThM requires contact and heat diffusion between the probe and the sample surface. This causes an associated heat diffusion delay, topography-related artifacts in the thermal images, artifacts resulting from heat exchange through the sides of the probe (rather than just the tip) and thus perturbs the original micro-scale temperature distribution of the sample.

Optical techniques, such as infrared thermography, fluorescence thermography, thermoreflectance microscopy, optical interferometry, and micro-Raman thermography, address these issues with optical non-contact temperature mapping, but the spatial resolution of optical thermometry is typically limited by the wavelength of the radiation employed and cannot reach the typical feature sizes of current nano-engineered systems. Although near field scanning optical microscopy breaks the diffraction limit of optical systems and provides higher spatial resolution by employing an optical fiber or an SPM tip with an ultra-small aperture close enough to the sample surface, it is still subject to the typical draw backs of SPM-based temperature mapping techniques. Also, since the tip is very close to the surface, the tip itself can undergo heating from the sample and suffer a change in geometry, affecting the reflected signal.

Thin coating methods, such as liquid crystal thermography, use the color change of a liquid crystal coating deposited on the sample surface for temperature indication. However, issues with the thermal conductivity, heat capacity, and non-uniformity of the liquid crystal coating may lower the accuracy of the temperature measurement. Also, the thin coating may perturb the temperature distribution of the sample, and the spatial resolution of thin coating methods is still limited by the long optical wavelength.

BRIEF SUMMARY

Embodiments of the subject invention employ a new temperature measurement mechanism, the temperature sensitive electron signal in a scanning electron microscope (SEM). Embodiments of the subject invention also provide both high spatial resolution and non-contact temperature measurement no existing techniques can adequately combine. The subject invention overcomes the problems associated with existing temperature measurement techniques, such as temperature perturbation caused by the contact probe and the spatial resolution limitations due to the optical wavelength.

Systems, methods, and computer-readable media for temperature measurement are disclosed. Temperature measurement according to embodiments of the subject invention has high spatial resolution.

In an embodiment, a method of measuring the temperature of a sample can include: initiating an electron beam of a scanning electron microscope (SEM) to interact with the sample; obtaining a temperature sensitive signal from the sample using an electron backscatter diffraction (EBSD) detector after the interaction with the sample; and analyzing the temperature sensitive signal to determine a temperature of the sample. This is a non-contact measurement method such that no physical contact is made between the SEM and the region of the sample where the temperature measurement is performed (at least during the initiation of the electron beam and while the temperature sensitive signal is obtained). The spatial resolution of the temperature determination can be high (e.g., 100 nm or better).

In an embodiment, a computer-readable medium can have computer-executable instructions for performing a method including: initiating an electron beam of an SEM to interact with a sample; collecting a temperature sensitive signal from the sample using an EBSD detector after initiating the electron beam; and analyzing the temperature sensitive signal to determine a temperature of the sample.

Embodiments of the subject invention advantageously provide very sensitive temperature measurement, with nano-scale resolution (e.g., resolution of 100 nm or less, or resolution of 10 nm or less).

Embodiments of the subject invention advantageously allow for non-contact far-field in situ temperature measurement. The essentially non-invasive techniques can provide in situ temperature measurement of samples, including in principle operating devices, without any specialized preparation.

Embodiments of the subject invention advantageously allow for collection of thermal, topographical, and other SEM images simultaneously from the same field of view.

In addition, systems, methods, and computer-readable media of the subject invention are easily integrated with existing SEMs. The hardware setup can be identical or nearly identical to a typical SEM equipped with an EBSD detector.

Embodiments of the subject invention can add a new channel—the temperature signal—to the collection of existing SEM signals. Multiple signals or contrast mechanisms, such as temperature maps, grain orientation maps, topographic images, and elemental maps can be obtained from the same sample area simultaneously so that the temperature distribution can be easily correlated to other materials structure and properties. Moreover, systems, methods, and computer-readable media of the subject invention are capable of zooming over a broad range of fields of view very easily and quickly.

Embodiments of the subject invention provide temperature measurement that is sensitive to surface temperature (e.g., several nanometers deep) and have broad applications (e.g., measurement and/or study of heat generation and transfer in a wide range of engineering systems, such as microelectronic, optoelectronic systems, and micromechanical systems).

This Summary is provided to introduce a selection of concepts in a simplified foam that are further described below in the Detailed Description. This Summary is not intended to identify key features or essential features of the claimed subject matter, nor is it intended to be used to limit the scope of the claimed subject matter.

DETAILED DISCLOSURE

Figure 1:
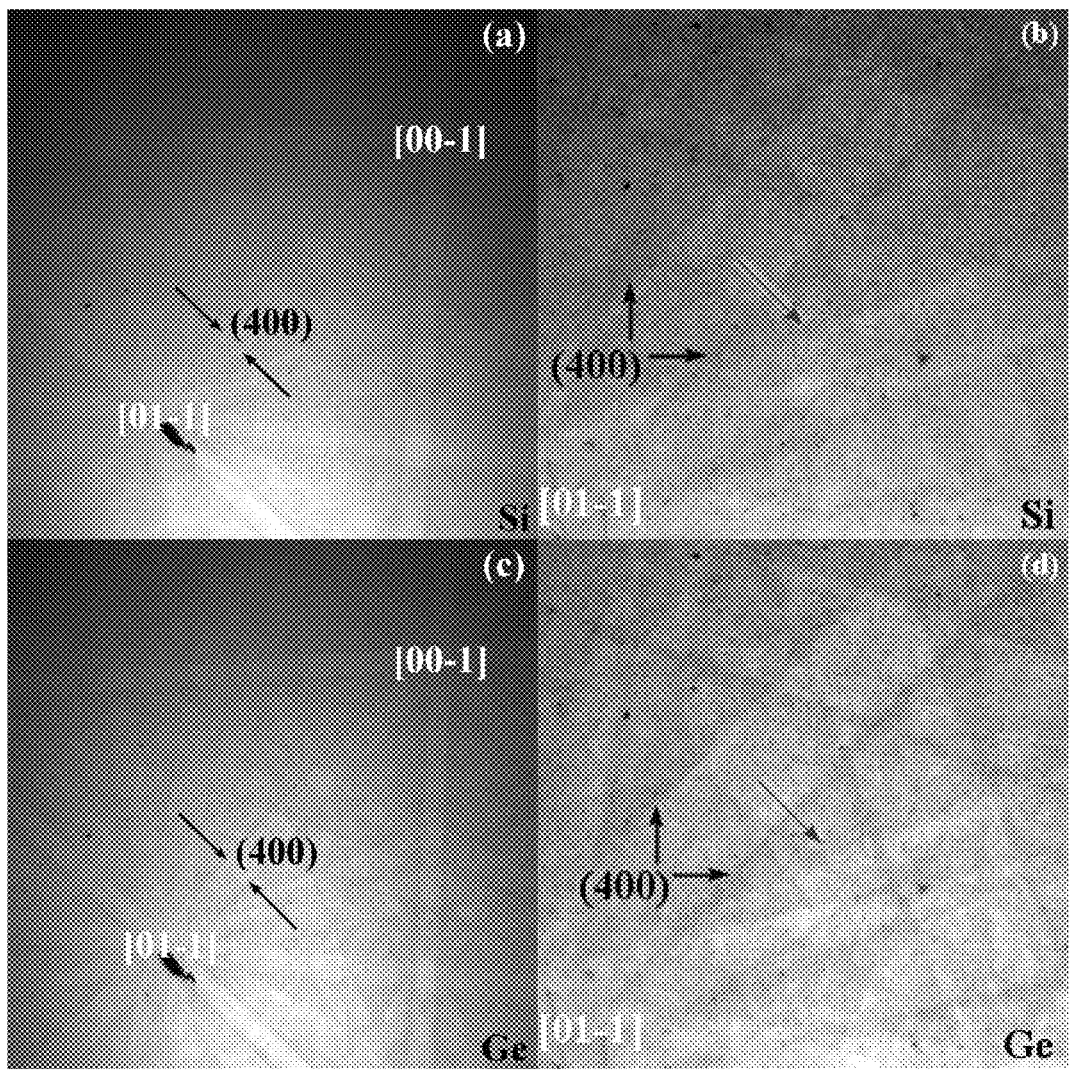
FIG. 1A shows an image of an electron backscatter diffraction (EBSD) pattern.
FIG. 1B shows an image of a scan line location across a Kikuchi line.
FIG. 1C shows an image of an EBSD pattern.
FIG. 1D shows an image of a scan line location across a Kikuchi line.

Systems, methods, and computer-readable media for temperature measurement are disclosed. Temperature measurement according to embodiments of the subject invention employs a new mechanism, temperature dependent thermal diffuse scattering (TDS) in electron backscatter diffraction (EBSD) in SEM, for temperature measurement, and provides both high spatial resolution and non-contact measurement capabilities no existing techniques can adequately combine.

In many embodiments, temperature measurement is performed using a scanning electron microscope (SEM) and can be referred to as thermal scanning electron microscopy (ThSEM). Such temperature measurement can be non-contact, such that no physical contact is made between the SEM and the sample region where the temperature measurement is performed and the temperature distribution to be measured is not perturbed by any physical contact. The SEM may make contact with the sample (e.g., the underside of the sample) to hold it in place and still be considered a "non-contact" temperature measurement, as long as there is no physical contact between the SEM and the portion of the sample from which the temperature measurement is being obtained. That is, one side of the sample may be placed on a portion of the SEM to hold it in place, and temperature may be measured on at least a portion of another side of the sample (e.g., the opposite side to the side making contact with the SEM); no contact is made between the portion of the SEM making the temperature measurement and the region of the sample from which the temperature measurement is being taken. Temperature measurement can use temperature dependent electron TDS in electron backscatter diffraction (EBSD) in an SEM.

In an embodiment, a method of measuring the temperature of a sample can include: initiating an electron beam of an SEM to interact with the sample; obtaining a temperature sensitive signal from the sample using an EBSD detector after the interaction with the sample; and analyzing the temperature sensitive signal to determine a temperature of the sample. This is a non-contact measurement method as discussed in the previous paragraph. The spatial resolution of the temperature determination can be high (e.g., 100 nm or better). Obtaining the temperature sensitive signal can include collecting at least one EBSD pattern, and the EBSD pattern(s) can be analyzed to determine the temperature (e.g., the local temperature) of the sample by, for example, comparing the EBSD pattern(s) to calibration data (e.g., the EBSD pattern(s) obtained from the same location on the sample at a series of predetermined temperatures) and/or calculating the temperature based on features of the EBSD pattern(s), though embodiments are not limited thereto. The temperature determined can be a relative temperature of the sample (i.e., temperature of a point or portion of the sample relative to one or more other points and/or portions of the sample), an absolute temperature of the sample, or both.

In an embodiment, a computer-readable medium can have computer-executable instructions for performing a method including: initiating an electron beam of an SEM to interact with a sample; collecting a temperature sensitive signal from the sample using an EBSD detector after initiating the electron beam; and analyzing the temperature sensitive signal to determine a temperature of the sample. A temperature sensitive signal contains information about the temperature (relative, local, and/or absolute) of a sample. A temperature sensitive signal includes, but is not limited to, an electron signal and/or an optical signal.

Unlike existing scanning thermal microscopy techniques, which use contact probes, ThSEM is a non-contact method. In contrast to optical temperature mapping techniques, ThSEM is not limited in spatial resolution by the optical wavelength. In fact, temperature measurement systems, methods, and computer-readable media according to embodiments of the subject invention can reach a spatial resolution of 100 nm or less.

In certain embodiments, a system can include a hardware setup that is similar to the EBSD system in an SEM, thereby simplifying the integration of temperature mapping into SEM. Moreover, multiple signals or contrast mechanisms, such as temperature distributions, grain orientation maps, topographic images, and elemental maps can be obtained from the same sample area depending on the specific SEM capability. Thus, in an embodiment, the subject invention can add a new channel, the temperature signal, to the collection of existing SEM signals.

ThSEM can advantageously achieve both high spatial resolution and non-contact temperature measurement capabilities. Instead of using a contact probe or an optical probe, ThSEM takes advantage of the temperature dependent TDS effect in EBSD in an SEM. Unlike SThM, which can only scan a small field of view, ThSEM preserves the merits of SEM and can zoom over a broad range of fields of view. A spatial resolution of, for example, less than 100 nm or even less than 10 nm can be attained. In certain embodiments, an SEM can be operated at a low beam energy to obtain an excellent spatial resolution (e.g., less than 10 nm).

In many embodiments, a temperature measurement method can include performing an electron scattering process using an SEM. The electron scattering process can include incoherent scattering of incident beam electrons followed by elastic and coherent scattering of these electrons. Then, EBSD data can be obtained (e.g., using the SEM) after the electron scattering process. The EBSD data can include EBSD Kikuchi patterns. EBSD patterns can be collected at multiple temperatures. For example, EBSD patterns can be collected at different temperatures with the electron beam of the SEM in spot mode. EBSD patterns at different temperatures can be indexed and then analyzed. For example, EBSD patterns can be analyzed in a computer program, such as ImageJ (imagej.nih.gov/ij), though embodiments are not limited thereto.

In an embodiment, the mean intensities of the entire EBSD patterns at a series of temperatures can be calculated and plotted as a function of temperature. The intensity of each pattern pixel at a given temperature can be used to generate a normalized pattern.

In an embodiment, a scan line perpendicular or approximately perpendicular to a Kikuchi excess line of interest can be drawn, and the intensity of each pixel along the line can be plotted as a function of the pixel position. The Kikuchi line can be chosen, e.g., as a line which is known to provide high temperature resolution, though embodiments are not limited thereto. A wide line (for example, of 2 to 50 pixels or more) can be drawn (e.g., in an analysis program such as ImageJ) to further decrease the noise of the data, though embodiments are not limited thereto. The position of the Kikuchi line can be identified, and the normalized intensity of the Kikuchi line can be plotted as a function of temperature. The Debye-Waller B-factors for the sample at different temperatures can be calculated. The Debye-Waller B-factor calculation can be used to assess results of the temperature measurement technique, and the temperature measurement does not require calculation of the Debye-Waller B-factor.

In many embodiments, a temperature sensitive signal can be obtained from a sample. This can include collecting at least one EBSD pattern and analyzing the intensity of at least one Kikuchi line of the at least one EBSD pattern. The temperature sensitive signal can be generated by, e.g., electron thermal diffuse scattering, phonon scattering, or both.

In an embodiment, at least one EBSD pattern can be collected from each location of a plurality of locations on the sample, and the EBSD patterns can be analyzed to determine the temperature distribution of the sample.

In an embodiment, a temperature measurement process can include a calibration process, which can be followed by a measurement process. The calibration process can include obtaining calibration temperature sensitive signals from the sample (e.g., from the same sample locations to be measured later) at multiple predetermined temperatures. This can be done by, for example, changing the temperature of the whole sample uniformly using a heating stage on which the sample is mounted and determining the uniform temperature using a measurement device (e.g., a thermocouple) as the calibration temperature sensitive signals are being collected. The calibration temperature sensitive signals from each sample location at the known temperatures can be stored (e.g., in a calibration file). The measurement process can then be performed and can include obtaining temperature sensitive signals from the sample locations with calibration files while the sample is in the condition in which the sample local temperature is intended to be measured (e.g., a device sample when the device is turned on). The obtained temperature sensitive signal from each location can be compared to the calibration temperature sensitive signals with known temperatures in its corresponding file to determine the temperature of that sample location.

In an embodiment, a temperature measurement process can include a calibration process followed by a measurement process. The calibration process can include obtaining EBSD patterns from the same sample locations to be measured later at multiple predetermined temperatures. This can be done by, for example, changing the temperature of the whole sample uniformly using a heating stage on which the sample is mounted and determining the uniform temperature using a measurement device (e.g., a thermocouple) as the EBSD patterns are being collected. The EBSD patterns from each sample location at the known temperatures can be stored (e.g., in a calibration file). The measurement process can then be performed and can include obtaining EBSD patterns for the sample locations with calibration files while the sample is in the condition in which the sample local temperature is intended to be measured (e.g., a device sample when the device is operating) and comparing the obtained EBSD pattern from each location to the EBSDs in its corresponding calibration file with known temperatures to determine the temperature of that sample location.

In an embodiment, a temperature mapping process can include a calibration process followed by a measurement process. The calibration process can include scanning the electron beam in a field of view on the sample and obtaining an EBSD pattern for each pixel in the field of view at multiple predetermined temperatures (e.g., by changing the temperature of the whole sample uniformly using a heating stage on which the sample is mounted as the EBSD patterns are being collected, so that the actual temperature at which the EBSD pattern is collected equals to the uniform temperature which can thus be determined by a temperature measurement device such as a thermocouple). The EBSD patterns at the known temperatures from each pixel can be stored (e.g., in a calibration file). The measurement process can then be performed and can include obtaining an EBSD pattern for each pixel while the sample is in the condition in which the sample temperature distribution is intended to be mapped (e.g., a IC device sample when the device is operating) and comparing the obtained EBSD pattern from each pixel to the EBSDs at known temperatures for that pixel in its corresponding calibration file to determine the temperature of this pixel. A temperature map can thus be obtained.

In an embodiment, an EBSD energy filter can be used to collect one or more EBSD patterns formed by electrons within a certain energy range so that the temperature resolution of the measurement can be improved.

In an embodiment, at least one EBSD pattern can be normalized by the mean intensity of the whole pattern in order to eliminate the temperature sensitive signals other than the signal caused by electron TDS.

In many embodiments, a computer-readable medium (e.g., a non-transitory computer-readable medium) can be used to implement a temperature measurement method as described herein (e.g., a ThSEM method as described herein). That is, a computer-readable medium can have software stored thereon and designed to control an SEM to perform ThSEM temperature measurement. The software can control the SEM to perform an electron scattering process, and the electron scattering process can include incoherent scattering of incident beam electrons followed by elastic and coherent scattering of these electrons. Then, the software can obtain EBSD data (e.g., using the SEM) after the electron scattering process. The EBSD data can include EBSD Kikuchi patterns. EBSD patterns can be collected at multiple temperatures. EBSD patterns at different temperatures can be indexed and then analyzed. Either or both of these tasks can be performed by the software or externally. For example, EBSD patterns can be analyzed in a computer program, and the computer program for analyzing the EBSD patterns can be included on the computer-readable medium, though embodiments are not limited thereto. A computer-readable medium of the subject invention can be, for example, a compact disc (CD), digital video disc (DVD), flash memory device, volatile memory, or a hard disk drive (HDD), such as an external HDD or the HDD of a computing device, though embodiments are not limited thereto. A computing device can be, for example, a laptop computer, desktop computer, server, cell phone, or tablet, though embodiments are not limited thereto.

Figure 6:
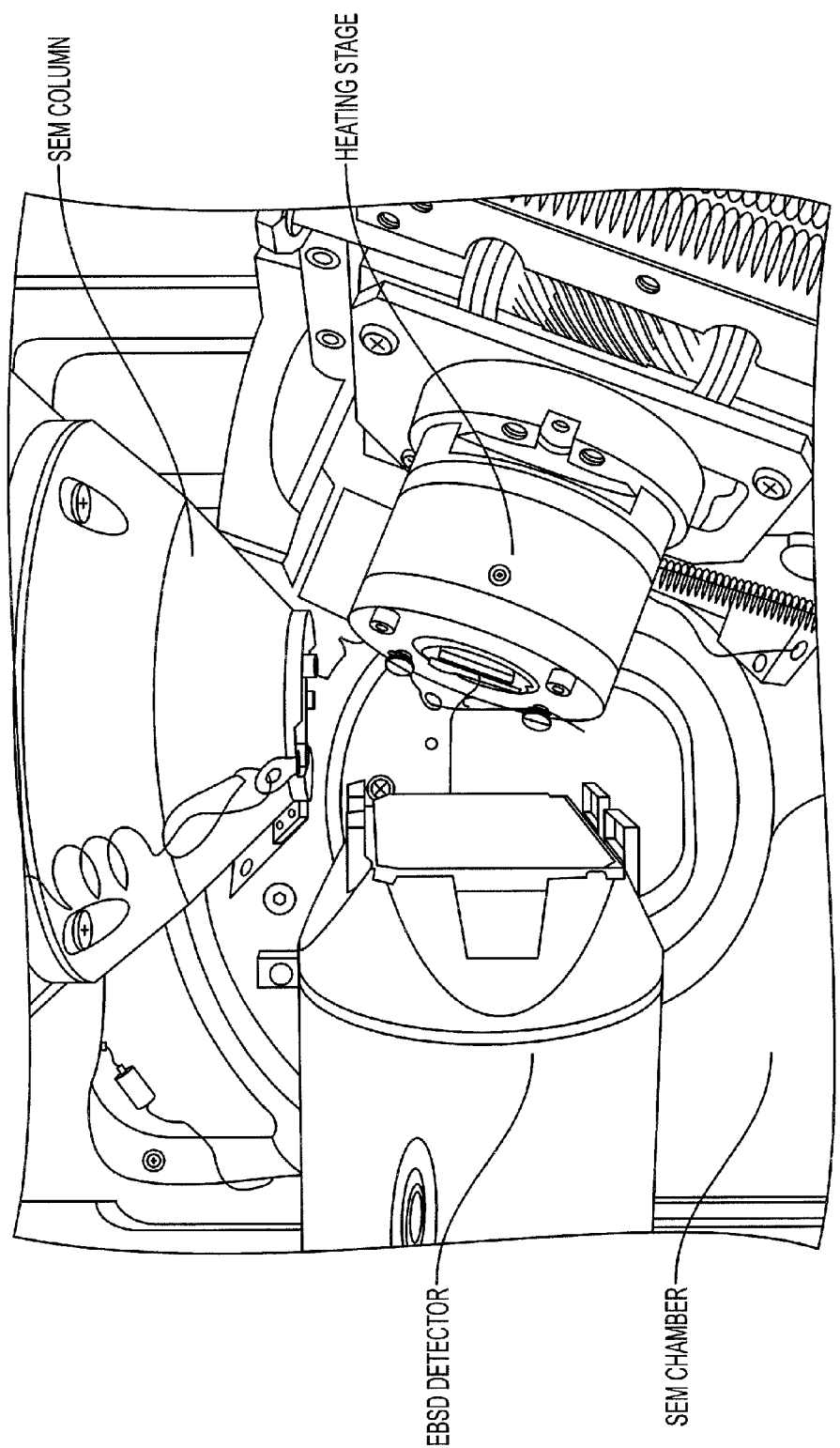
FIG. 6 shows an image of a scanning electron microscope (SEM) chamber that can be used according to an embodiment of the subject invention.

In many embodiments, a system can include an SEM and a computer-readable medium to implement a temperature measurement method as described herein (e.g., a ThSEM method as described herein). The computer-readable medium can be as described herein (e.g., in the previous paragraph). The system can include EBSD detector, which can be integrated with the SEM. In certain embodiments, the system can also include a heating stage and/or a chamber, and either or both of these components can be part of the SEM. FIG. 6 shows an image of an SEM that can be used according to embodiments of the subject invention. Referring to FIG. 6, the SEM includes an SEM chamber having an SEM column, and an EBSD detector. The SEM chamber can also include a heating stage.

ThSEM is a non-invasive method and can provide in situ temperature measurement of samples, including in principle operating devices, without any specialized preparation. It can also be easily integrated into software automation and image collection modes, for example using existing SEM hardware and/or software. ThSEM is based on fundamentally different mechanisms than TEM temperature measurement [34], utilizing backscattered electrons which have undergone both elastic and inelastic scattering events, as opposed to the forward scattered electrons employed in the TEM-based method.

In many embodiments, EBSD data is obtained using an SEM (e.g., an SEM having an EBSD system). The EBSD data can include EBSD Kikuchi patterns and can be obtained by performing an electron scattering process. The electron scattering process can include incoherent scattering of incident beam electrons followed by elastic and coherent scattering of these electrons. In an embodiment, EBSD patterns can be collected at different temperatures (e.g., to perform a calibration process). For example, EBSD patterns can be collected at different temperatures with the electron beam of the SEM in spot mode. Each pattern can be an average of, for example, 20 frames or more of EBSD collection, which can help reduce noise. In an embodiment, a temperature calibration (e.g., an absolute temperature calibration) can be performed on the sample before temperature measuerment. Increasing the number of frames collected can reduce the background noise and thus increase the effective temperature resolution, though it can also increase the acquisition time.

The beam energy of the SEM during collection of EBSD patterns can be, for example, any of the following values, about any of the following values, no more than any of the following values, or at least any of the following values (all numerical values are in keV): 1, 5, 10, 15, 20, 25, 30, 35, 40, 45, 50, 100, or 150. For example, the beam energy of the SEM during collection of EBSD patterns can be 20 keV.

In certain embodiments, EBSD patterns at different temperatures can be indexed and then analyzed. For example, EBSD patterns can be analyzed in a computer program, such as ImageJ (imagej.nih.gov/ij). In an embodiment, the sample can be heated and slowly cooled to ensure that the temperature of the sample is close to uniform for each measurement. The mean intensities $I_{mean}$ of the whole patterns at a series of temperatures can be calculated and plotted as a function of temperature. The intensity of each pattern pixel I at a given temperature (as determined by a thermocouple on the sample surface) can then be divided by the mean intensity of this pattern to generate a normalized pattern:

$$I_{normalized} = \frac{I}{I_{mean}} \quad (1)$$

This normalization process can suppress intensity variations from sources other than the desired TDS variations.

The Kikuchi lines in an EBSD pattern include an excess line and a deficient line. The excess and the deficient lines can be determined by their relative positions to the direction of maximum intensity [22]. In an embodiment of the subject invention, excess lines are used for temperature measurement. A scan line perpendicular to the Kikuchi excess line of interest can be drawn, and the intensity of each pixel along the line can be plotted as a function of the pixel position. A wide line (for example, of 2, 5, 10, 20, 50 pixels or more) can be drawn (e.g., in an analysis program such as ImageJ) to further decrease the noise of the data, though embodiments are not limited thereto. The position of the Kikuchi line can be identified, and the normalized intensity of the Kikuchi line can be plotted as a function of temperature.

In order to compare the intensity change with temperature to the electron TDS theory, the Debye-Waller B-factors for the sample at different temperatures can be calculated using fourth-degree polynomial regression fitting, with regression parameters obtained from inelastic neutron scattering [25] [26]. With the B-factors thus obtained, the Debye-Waller factors can be calculated according to the following equation.

$$\frac{I}{I_0} = \exp(-2Bs^2) \quad (2)$$

where I is the scattering intensity with thermal vibration, $I_0$ is the scattering intensity from the rigid lattice, B is the Debye-Waller B-factor, and $s=(\sin \theta)/\lambda$, where $\theta$ is the Bragg diffraction angle and $\lambda$ is the wavelength of the electrons. The Debye-Waller factor calculation can be used to assess results of the temperature measurement technique, and the temperature measurement does not require calculation of the Debye-Waller factor.

FIG. 1A shows an example image of an EBSD pattern, and FIG. 1B shows an image of a scan line location across a Kikuchi line. Referring to FIG. 1A, the EBSD pattern was formed by incoherent scattering of the primary beam electrons followed by elastic and coherent scattering of these electrons. The first scattering process creates a wide directional distribution of electrons from a point-like electron source inside the crystal while the second step coherently scatters these electrons about the relevant Bragg angle. The second step determines the location of the Kikuchi lines, as well as their intensity distribution.

Due to the thermal motion of the atoms, the electrons in the second coherent scattering step may also be incoherently scattered by phonons, which lowers the intensity of the excess Kikuchi lines compared to the intensity in the absence of phonon scattering. As a result, thermal diffuse scattering may alter the intensity distribution of the EBSD pattern by lowering the intensity of the Kikuchi lines (which are the location of the coherently scattered electrons) but increasing the background intensity near the Kikuchi lines (by incoherent thermal diffuse scattering). The Debye-Waller factor (DWF) is the ratio of the coherent scattering of electrons by scattering centers with thermal motion to the value for the same process without thermal motion, that is, the DWF is the probability of the coherent scattering process while (1-DWF) is the probability of the incoherent process (as in Equation (2)).

However, the DWF only describes the intensity drop of Kikuchi lines due to thermal diffuse scattering. There will also be other factors, such as temperature-dependent black body radiation detected by the EBSD phosphor screen and the effects due to temperature dependence of the incoherent scattering yield in the first step of the Kikuchi line formation process. Unlike thermal diffuse scattering, which lowers the Bragg diffraction intensity and increases the diffuse intensity while leaving the mean intensity of the whole EBSD pattern essentially unchanged, these additional factors can alter the total pattern intensity, while leaving the local intensity distributions essentially unchanged.

Figure 2:
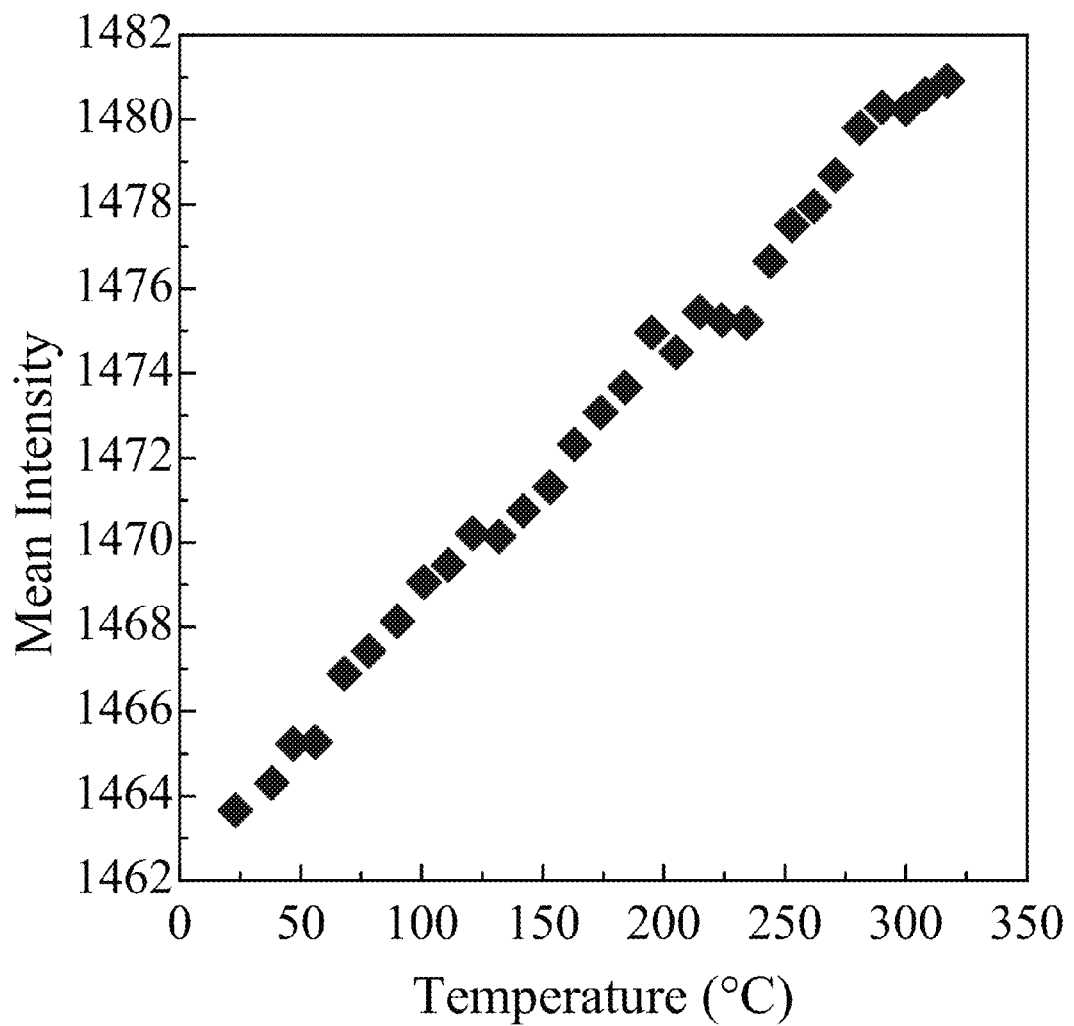
FIG. 2 shows a plot of mean intensity as a function of temperature for a sample.

FIG. 2 is a plot of mean intensity (gray level) of an entire EBSD pattern as a function of temperature from a sample. Referring to FIG. 2, with the mean intensity of the whole pattern for each temperature measured (FIG. 2), the contributions discussed in the previous paragraph can be eliminated from the Kikuchi line intensity variation by the pattern normalization described earlier. Thus, the normalized Kikuchi line intensity change with temperature is due almost exclusively to TDS and can be described quantitatively by the DWF.

Figure 3A:
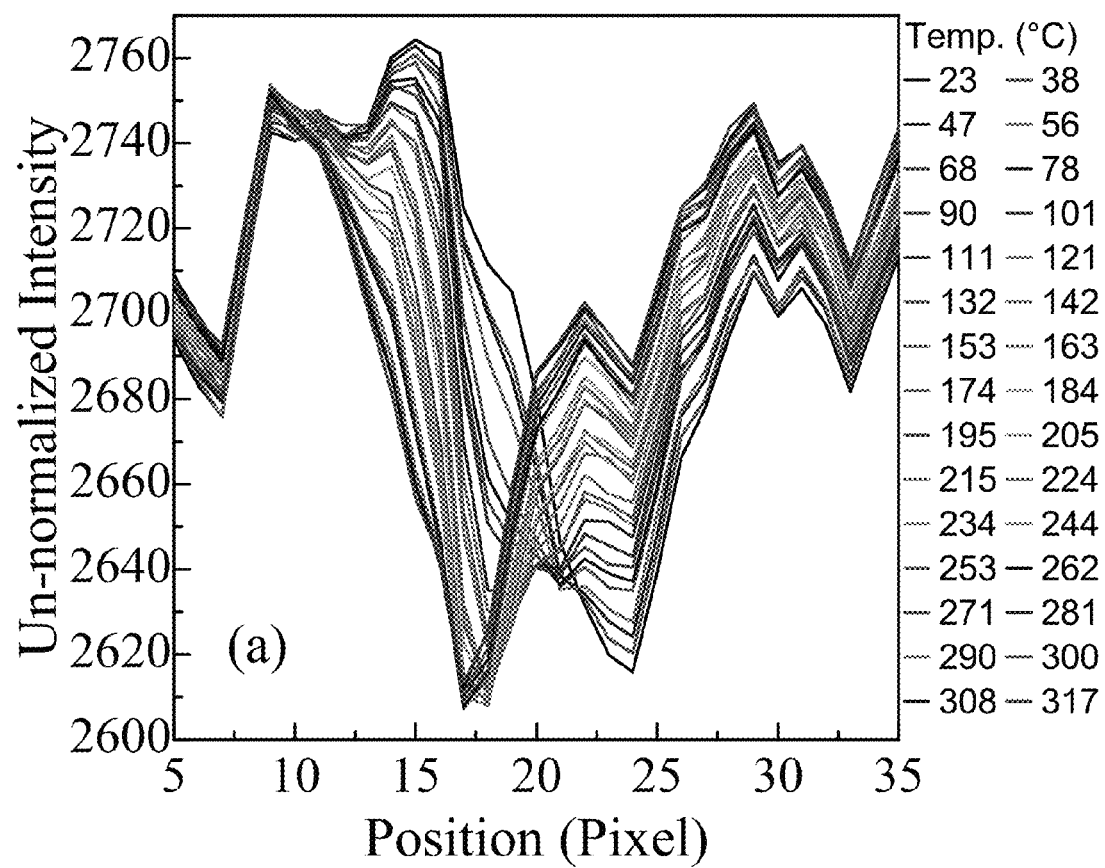
FIG. 3A shows a plot of intensity as a function of position for an un-normalized pattern.
Figure 3B:
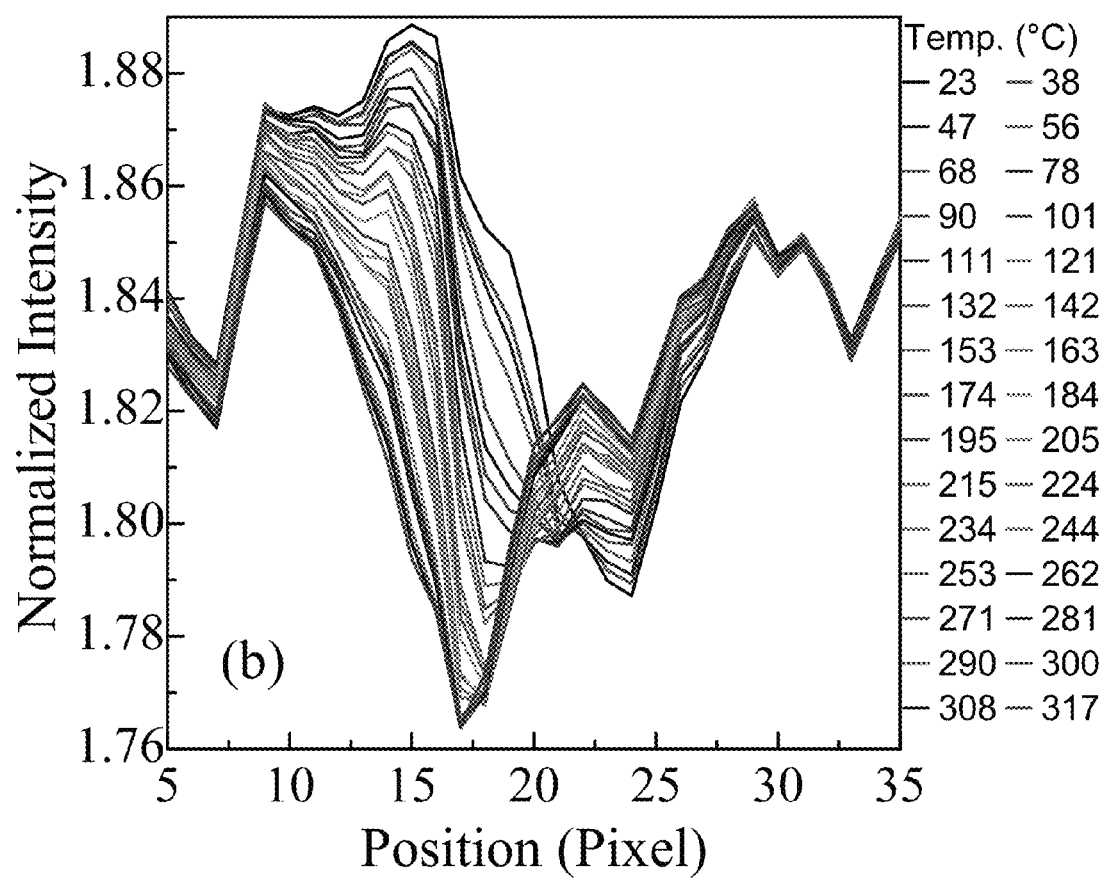
FIG. 3B shows a plot of intensity as a function of position for a normalized pattern.

FIGS. 3A and 3B show plots of intensity as a function of position along the scan lines across the Kikuchi lines. FIG. 3A shows a plot for an un-normalized pattern, and FIG. 3B shows a plot for a normalized pattern. These plots were obtained from a silicon {100} sample as shown in FIGS. 1A and 1B. Each pixel in the EBSD patterns corresponds to a crystallographic angular increment of 0.06° or approximately 0.06°. Referring to FIGS. 3A and 3B, each colored curve corresponds to the intensity across the selected Kikuchi line for a certain temperature. The peak at around pixel 15 is the intensity at the Kikuchi excess line. FIG. 3 shows that, as the temperature goes up, this peak intensity goes down. Beyond around pixel 20, these curves enter the region where diffuse scattering dominates, and the intensity then increases with increasing temperature. This intensity dependence results from TDS, in which incoherent phonon scattering decreases the intensity in the Bragg direction but increases the background intensity.

By comparing FIG. 3A and FIG. 3B, it is noted that after normalization, the normalized peak intensity at different temperatures far away from the Kikuchi line are almost the same (e.g., the intensities from pixel 30 to pixel 35), whereas the intensity without normalization increases as temperature increases even in the area far away from the Kikuchi line. This indicates that temperature dependent effects other than TDS are also present, but unlike TDS, the combination of these effects increase the intensities of all the pixels in the EBSD pattern and thus can be eliminated by the intensity normalization.

The intensity in the absence of thermal motion ($I_0$ in Equation (2)) is known. In order to scale the DWF calculations to experimental curves, the DWF can be multiplied by a scaling factor (C) to align its magnitude to measured data (as in Equation (3)). This scaling factor can be determined by maximizing the coefficient of determination $R^2$. It should be noted that only the pre actor in (3) is adjusted by this procedure; the term of $-2Bs^2$ is still the original value calculated and is not adjusted.

$$I_{normalized} = \frac{I_0}{I_{mean}}\exp(-2Bs^2) = C\exp(-2Bs^2) \quad (3)$$

Figure 4A:
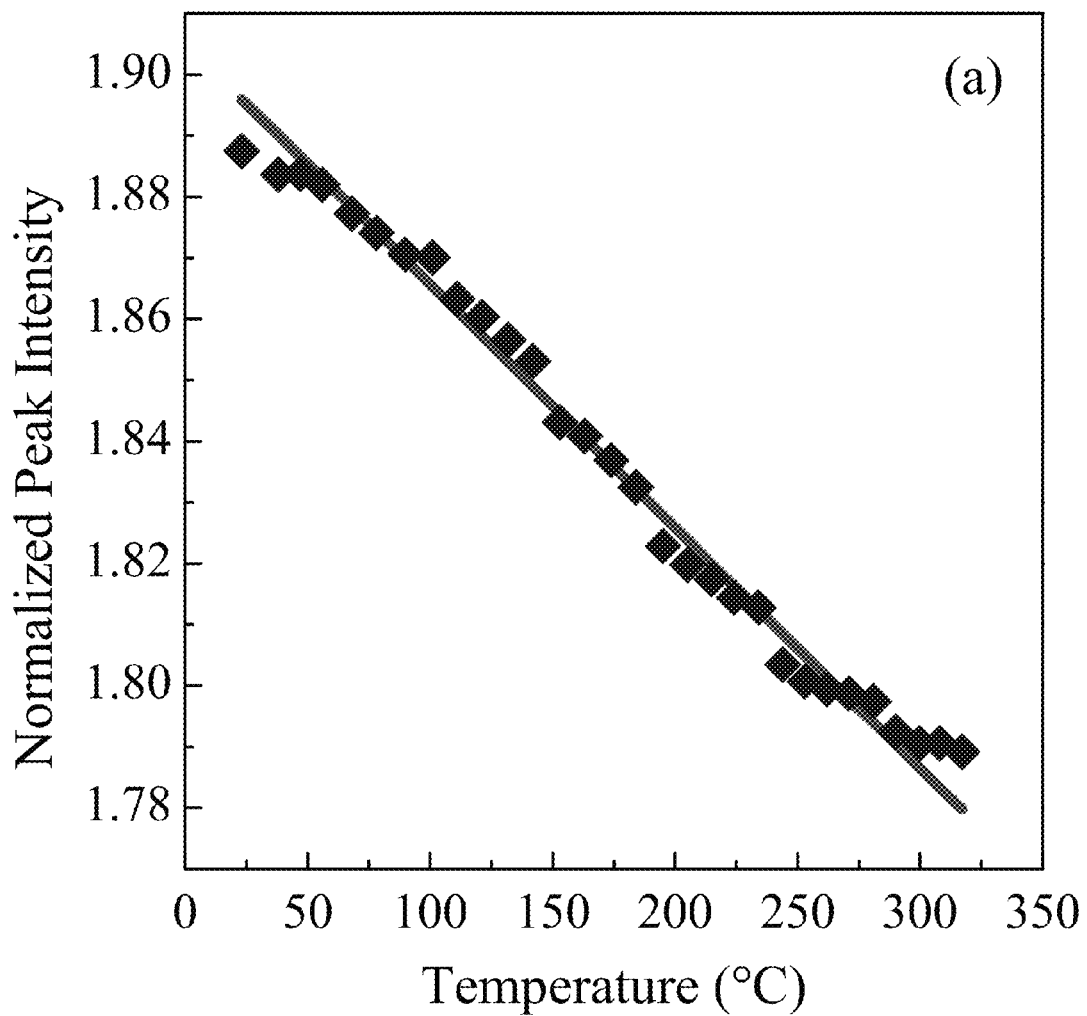
FIG. 4A shows a plot of normalized peak intensity as a function of temperature for a sample.
Figure 4B:
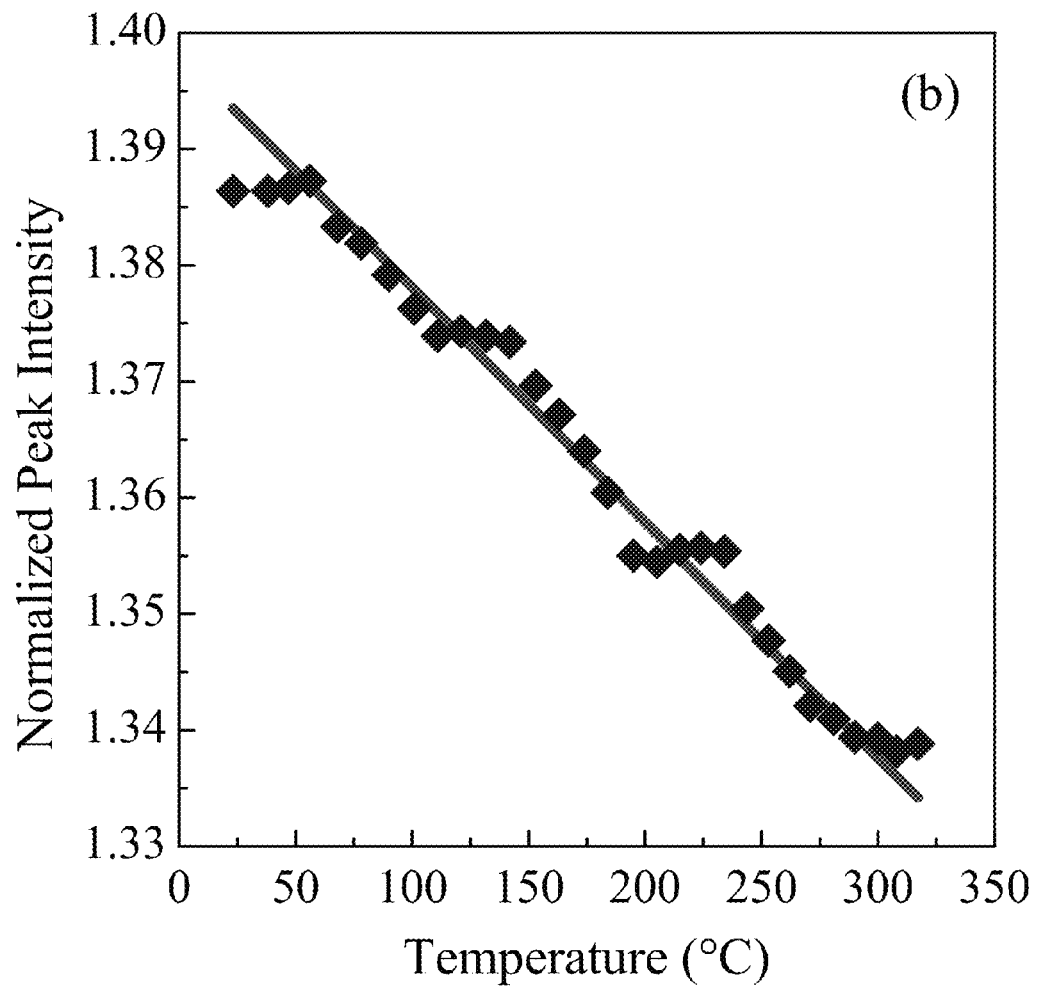
FIG. 4B shows a plot of normalized peak intensity as a function of temperature for a sample.
Figure 4C:
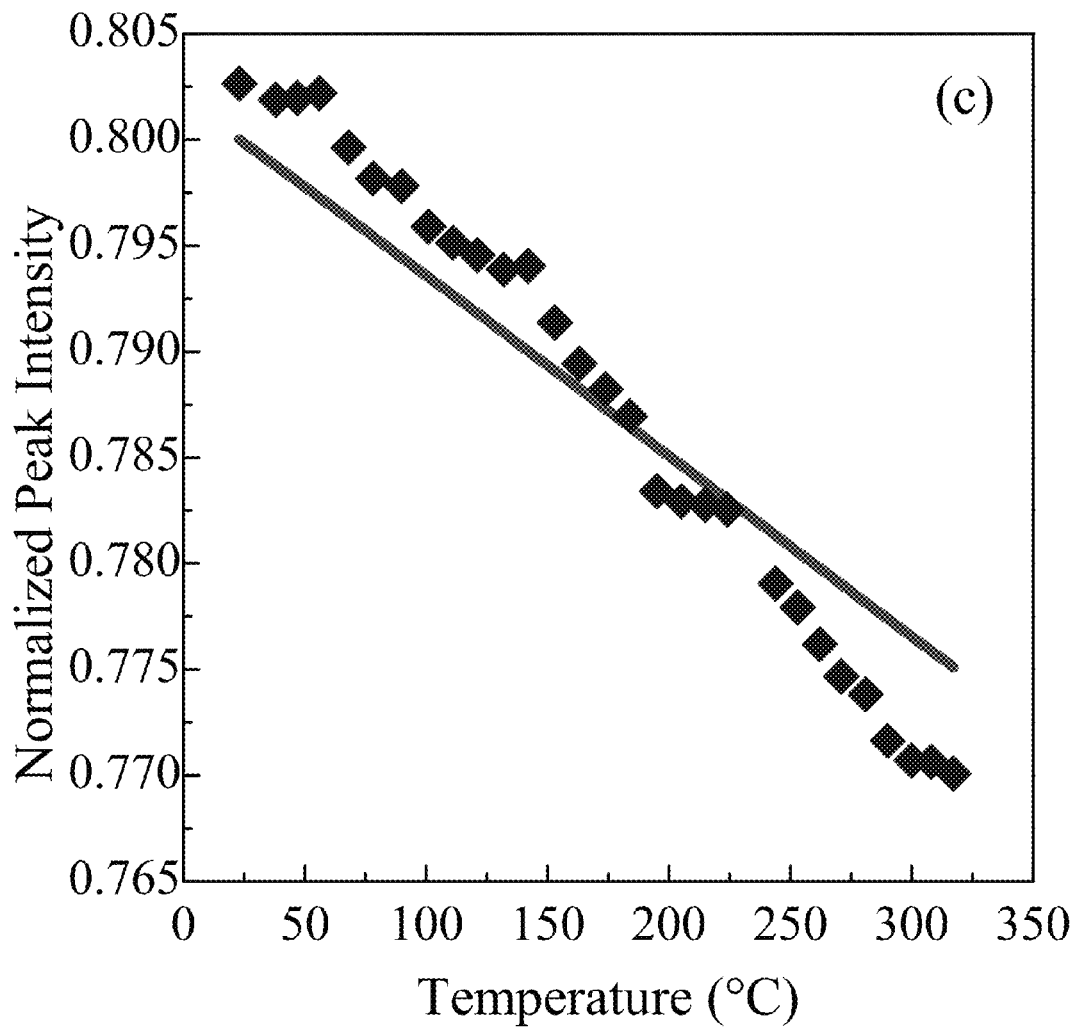
FIG. 4C shows a plot of normalized peak intensity as a function of temperature for a sample.

FIGS. 4A, 4B, and 4C show plots of normalized peak intensity as a function of temperature. FIG. 4A shows a plot for (400) $R^2$=0.986, FIG. 4B shows a plot for (131) $R^2$=0.977, and FIG. 4C shows a plot for (220) $R^2$=0.902. Kikuchi lines from the silicon {100} sample (blue diamonds) can be calculated from Debye Waller factor (red curve).

Referring to FIG. 4A, the peak intensity can be defined as the excess (400) Kikuchi line position determined by the linear scans as shown in FIGS. 1 and 3. From FIG. 4A, it is noted that the normalized peak intensity decreases by about 5% as the temperature increases from 23° C. to 317° C., corresponding to an average decrease of 0.018% per degree.

The temperature resolution of ThSEM according to embodiments of the subject invention can be, for example, any of the following values, about any of the following values, no more than any of the following values, or at least any of the following values (all numerical values are in ° C.): 0.001, 0.01, 0.1, 1, 2, 2.9, 3, 4, 5, 6, 7, 8, 9, 10, 11, 12, 13, 14, 15, 16, 17, 18, 19, 20, 21, 22, 23, 24, or 25. For example, the temperature resolution can be 10° C. or less, or 2.9° C. or less.

Taking the partial derivative on both sides of Equation (3) with respect to temperature T gives Equation (4).

$$\frac{\partial I_{normalized}}{\partial T} = -\frac{I_0}{I_{mean}}\left(2s^2\frac{\partial B}{\partial T} + \frac{\partial I_{mean}}{I_{mean}\partial T}\right)\exp(-2Bs^2) \quad (4)$$

The minus sign in front of the right hand side of Equation (4) means that $I_{normalized}$ decreases with temperature. The second term in the parenthesis in Equation (4), may be lower (e.g., an order of magnitude lower) than the first term, meaning that the TDS effect can dominate the dependence of normalized intensity upon temperature. In order to achieve excellent temperature sensitivity, $\partial I_{normalized}/\partial T$ can be maximized. According to Equation (4), better temperature sensitivity is achieved if a Kikuchi line is chosen with higher $I_0$ and higher s (since the second order partial derivatives, $\partial^2 I_{normalized}/\partial T\partial s$ and $\partial^2 I_{normalized}/\partial T\partial I_0$, can be calculated to be.

The angular distribution of backscattered electrons for the sample with a high tilt angle can resemble an ellipse with the angle between the long axis and sample normal being approximately the same as the incident angle (e.g., 70°). In order to maximize $I_0$, a portion of the Kikuchi line in the brightest area in the EBSD pattern, that is, the area corresponding to the long axis direction, can be chosen for temperature measurement.

Referring to FIGS. 4B and 4C, as with FIG. 4A, these figures exhibit a decrease in Kikuchi line intensity with temperature. This trend demonstrates the higher temperature sensitivity associated with higher values of s predicted by Equation (4).

In an embodiment, a plot such as FIG. 4A can serve (e.g., in conjunction with a thermocouple measuring the sample surface temperature) as a reference for absolute temperature calibration under the appropriate set of conditions (beam current, beam voltage, stage-detector geometry, sample materials, etc.). Once calibrated, assuming the experimental condition for the reference sample and the sample of interest are the same, ThSEM can then be used to perform nano-scale absolute temperature measurement and mapping for other samples of interest.

In an embodiment, a modern field emission SEM can be used, and very low beam energy (down to less than 1 keV) can be obtained with greatly reduced aberrations, decreasing the escape area for electron energies with largest intensity to diameters of a few nanometers. Thus, with a small enough probe size and low enough electron energy, a temperature mapping resolution less than 10 nm can be achieved by ThSEM.

The spatial resolution of ThSEM according to embodiments of the subject invention can be, for example, any of the following values, about any of the following values, no more than any of the following values, or at least any of the following values (all numerical values are in nm): 1, 2, 3, 4, 5, 6, 7, 8, 9, 10, 11, 12, 13, 14, 15, 20, 30, 40, 50, 60, 70, 80, 90, 100, 200, 300, 400, 500, 600, 700, 800, 900, 950, 1000, 1500, 2000, 2500, 3000, or 10000. For example, the spatial resolution can be 10 μm (10,000 nm) or less. In many embodiments, the spatial resolution can be 100 nm or less.

The local temperature rise resulting from beam heating can be insignificant due to heat dissipation due to radial conduction in the bulk sample. The temperature rise in a stationary probe has been estimated as [33]

$$\Delta T = 3 U I_p f / 2 \pi \kappa R \qquad (5)$$

where U is the acceleration voltage, $I_p$ is the probe current, f is the fraction of incident electrons that do not leave the sample, κ is the thermal conductivity, and R is the electron range. In many embodiments, ΔT for the sample can be less than 0.1° C.

According to Equation (4), higher temperature sensitivity can be achieved for materials with a B-factor of a small absolute value but with a high first order derivative with respect to temperature (the sensitivity of B value to temperature). In order to demonstrate how B-factor affects temperature sensitivity, the exponential term in Equation (4) can be expanded by a Taylor series. Since the independent variable of the exponential function is very close to zero (the values of the $2B_s^2$ term for the (400) Kikuchi lines for most elements can be below 0.1 and even smaller for lower index Kikuchi lines), this exponential term can be approximated relatively well by only using the first two terms of its Taylor series without the higher order terms. Equation (6) is obtained after the above approximations.

$$\frac{\partial I_{normalized}}{\partial T} = -2 \frac{I_0}{I_{mean}} s^2 \frac{\partial B}{\partial T} (1 - 2Bs^2) \qquad (6)$$

Based on Equation (6), the effect of B value sensitivity (∂B/∂T) instead of the absolute value of B dominates ($2B_s^2$ is close to zero and $1-2B_s^2$ is close to one; changes in B thus do not affect the value of $1-2B_s^2$ much). As a result, materials with a high (∂B/∂T) value have high temperature sensitivity.

Based on Equation (4), the second order partial derivative $\partial^2 I_{normalized}/\partial T \partial I_0$ can be calculated to be negative, meaning the temperature sensitivity (the absolute value $|\partial I_{normalized}/$ ∂T|) increases with increasing $I_0$ (which is determined by the backscatter yield under the same electron probe current). Since the backscatter yield increases with increasing atomic number, materials with higher atomic numbers have higher temperature sensitivity. The second order partial derivative $\partial^2 I_{normalized}/\partial T \partial s$ can also be calculated to be negative and thus higher s values may be expected to result in higher temperature sensitivity. By substituting s using Bragg law, Equation (7) can be obtained.

$$s = \frac{\sin\theta}{\lambda} = \frac{n}{2d} = \frac{n\sqrt{h^2 + k^2 + l^2}}{2a_0} \qquad (7)$$

where d is the spacing between the (hlk) planes in the atomic lattice and $a_0$ is the (cubic) lattice constant.

According to Equation (7), if the temperature signal is extracted from Kikuchi lines of the same index, a large lattice constant results in a smaller s and thus materials with a larger lattice constant have lower temperature sensitivity. Systems, methods, and computer-readable media of the subject invention provide non-contact, nano-scale spatial resolution, differential temperature measurements with spatial resolution of less than 100 nm. In certain embodiments, spatial resolution of less than 10 nm can be achieved. Absolute temperature measurements can be made using calibrations from reference samples. Temperature sensitivity better than 10° C. (e.g., better than 3° C.) can be achieved. Temperature resolution is improved with reduction of extraneous sources of noise, increase in number of gray levels of an EBSD detector, and optimized adjustment of the intensity range of the EBSD detector to the relevant range of intensities measured. Temperature mapping can be performed using software on a computer-readable medium.

Embodiments of the subject invention advantageously provide very sensitive temperature measurement, with nano-scale resolution (e.g., resolution of 100 nm or less, or resolution of 10 nm or less).

Embodiments of the subject invention advantageously allow for non-contact far-field in situ temperature measurement. The essentially non-invasive techniques can provide in situ temperature measurement of samples, including in principle operating devices, without any specialized preparation.

Embodiments of the subject invention advantageously allow for collection of thermal, topographical, and other SEM images simultaneously from the same field of view.

In addition, systems, methods, and computer-readable media of the subject invention are easily integrated with existing SEMs. The hardware setup can be identical or nearly identical to a typical SEM equipped with an EBSD detector.

Embodiments of the subject invention can advantageously be applied to single crystal and polycrystalline materials, and can add a new channel—the temperature signal—to the collection of existing SEM signals. Multiple signals or contrast mechanisms, such as temperature maps, grain orientation maps, topographic images, and elemental maps can be obtained from the same sample area simultaneously so that the temperature distribution can be easily correlated to other materials structure and properties. Moreover, systems, methods, and computer-readable media of the subject invention are capable of zooming over a broad range of fields of view very easily and quickly.

Embodiments of the subject invention provide temperature measurement that is sensitive to surface temperature (e.g., several nanometers deep) and have broad applications (e.g., measurement and/or study of heat generation and transfer in a wide range of engineering systems, such as microelectronic, optoelectronic systems, and micromechanical systems).

The methods and processes described herein can be embodied as code and/or data. The software code and data described herein can be stored on one or more computer-readable media, which may include any device or medium that can store code and/or data for use by a computer system. When a computer system reads and executes the code and/or data stored on a computer-readable medium, the computer system performs the methods and processes embodied as data structures and code stored within the computer-readable storage medium.

It should be appreciated by those skilled in the art that computer-readable media include removable and non-removable structures/devices that can be used for storage of information, such as computer-readable instructions, data structures, program modules, and other data used by a computing system/environment. A computer-readable medium includes, but is not limited to, volatile memory such as random access memories (RAM, DRAM, SRAM); and non-volatile memory such as flash memory, various read-only-memories (ROM, PROM, EPROM, EEPROM), magnetic and ferromagnetic/ferroelectric memories (MRAM, FeRAM), and magnetic and optical storage devices (hard drives, magnetic tape, CDs, DVDs); network devices; or other media now known or later developed that is capable of storing computer-readable information/data. Computer-readable media should not be construed or interpreted to include any propagating signals.

A greater understanding of the present invention and of its many advantages may be had from the following examples, given by way of illustration. The following examples are illustrative of some of the methods, applications, embodiments and variants of the present invention. They are, of course, not to be considered in any way limitative of the invention. Numerous changes and modifications can be made with respect to the invention.

EXAMPLE 1

The EBSD data were obtained using a JEOL JEM 840 SEM with a custom-made heating stage from Ernest F. Fullam, Inc and an Oxford Instrument Nordlys II EBSD system. A two-step electron scattering process, consisting of incoherent scattering of incident beam electron followed by elastic and coherent scattering of these electrons, was performed to form EBSD Kikuchi patterns. The sample used for EBSD pattern collection at different temperatures was a single crystal {100} silicon wafer. The sample was mounted onto the hot stage in the SEM chamber using silver paint and the hot stage was tilted to 70° for EBSD collection. A K-type thermocouple was attached to the sample surface to provide an absolute calibration temperature. The hot stage and samples were then heated from room temperature to 400° C. and cooled back to room temperature very slowly to ensure that the temperature was close to uniform for each measurement. EBSD patterns at different temperatures were collected with the electron beam in spot mode with beam energy of 20 keV. Each pattern was an average of 20 frames of EBSD collection for noise reduction.

EBSD patterns at different temperatures were indexed and then analyzed in ImageJ (imagej.nih.gov/ij). The mean intensities $I_{mean}$ of the whole patterns at a series of temperatures were calculated and plotted as a function of temperature. The intensity of each pattern pixel I at a given temperature (as determined by a thermocouple on the sample surface) was then divided by the mean intensity of this pattern to generate a normalized pattern, as in Equation (1) above.

Excess Kikuchi lines were used for temperature measurement. A scan line perpendicular to the Kikuchi excess line of interest was drawn, and the intensity of each pixel along the line was plotted as a function of the pixel position. In order to further decrease the noise of the data, a line 20 to 50 pixels wide was drawn in ImageJ. The position of the Kikuchi line was identified, and the normalized intensity of the Kikuchi line was plotted as a function of temperature.

The Debye-Waller B-factors for Si at different temperatures were calculated using fourth-degree polynomial regression fitting, with regression parameters obtained from neutron inelastic scattering. With the B-factors thus obtained, the Debye-Waller factors were calculated according to Equation (2) above.

FIG. 1A shows an image of an EBSD pattern for a {100} wafer, and FIG. 1B shows an image of a scan line location across a (400) Kikuchi line. Referring to FIG. 1A, the EBSD pattern was formed by incoherent scattering of the primary beam electrons followed by elastic and coherent scattering of these electrons. The first scattering process created a wide directional distribution of electrons from a point-like electron source inside the crystal while the second step coherently scattered these electrons about the relevant Bragg angle. The second step determined the location of the Kikuchi lines and their intensity distribution.

Due to the thermal motion of the atoms, the electrons in the second coherent scattering step were also incoherently scattered by phonons, which lowered the intensity of the excess Kikuchi lines compared to the intensity in the absence of phonon scattering. As a result, thermal diffuse scattering alters the intensity distribution of the EBSD pattern by lowering the intensity of the Kikuchi lines (which are the location of the coherently scattered electrons) but increasing the background intensity near the Kikuchi lines (by incoherent thermal diffuse scattering).

The DWF is the ratio of the coherent scattering of electrons by scattering centers with thermal motion to the value for the same process without thermal motion, that is, the DWF is the probability of the coherent scattering process while (1-DWF) is the probability of the incoherent process (as in Equation (2)).

However, the DWF only describes the intensity drop of Kikuchi lines due to thermal diffuse scattering. There will also be other factors, such as temperature dependent black body radiation detected by the EBSD phosphor screen, and the effects due to temperature dependence of the incoherent scattering yield in the first step of the Kikuchi line formation process. Unlike thermal diffuse scattering, which lowers the Bragg diffraction intensity and increases the diffuse intensity while leaving the mean intensity of the whole EBSD pattern essentially unchanged, these additional factors alter the total pattern intensity, while leaving the local intensity distributions essentially unchanged. With the mean intensity of the whole pattern for each temperature measured (FIG. 2), these contributions can be eliminated from the Kikuchi line intensity variation by the pattern normalization described earlier. Thus, the normalized Kikuchi line intensity change with temperature is due almost exclusively to thermal diffuse scattering and can be described quantitatively by the DWF.

FIGS. 3A and 3B show plots of intensity as a function of position along the scan lines across the (400) Kikuchi lines. FIG. 3A shows a plot for an un-normalized pattern, and FIG. 3B shows a plot for a normalized pattern from the Si {100} sample shown in FIG. 1. Each pixel in the EBSD patterns corresponds to a crystallographic angular increment of 0.06°. Each colored curve in FIGS. 3A and 3B corresponds to the intensity across the selected Kikuchi line for a certain temperature. The peak at around pixel 15 is the intensity at the Kikuchi excess line. It is apparent that, as the temperature goes up, this peak intensity goes down. Beyond around pixel 20, these curves enter the region where diffuse scattering dominates, and the intensity then increases with increasing temperature. As described before, this intensity dependence results from TDS, in which incoherent phonon scattering decreases the intensity in the Bragg direction but increases the background intensity.

By comparing FIG. 3A and FIG. 3B, it is noted that after normalization, the normalized peak intensity at different temperatures far away from the Kikuchi line are almost the same (e.g., the intensities from pixel 30 to pixel 35) whereas the intensity without normalization increases as temperature increases even in the area far away from the Kikuchi line. This indicates that temperature dependent effects other than TDS are also present, but unlike TDS, the combination of these effects increase the intensities of all the pixels in the EBSD pattern and thus can be eliminated by the intensity normalization.

The intensity of the Kikuchi lines was observed at different temperatures, but we did not know the intensity in the absence of thermal motion ($I_0$ in Equation (2)). In order to scale the DWF calculations to the experimental curves, the DWF was multiplied by a scaling factor (C) to align its magnitude to our measured data (as in Equation (3)). This scaling factor was determined by maximizing the coefficient of determination $R^2$. It should be noted that only the prefactor in Equation (3) was adjusted by this procedure; the term of $-2Bs^2$ was still the original value calculated and was not adjusted.

FIGS. 4A, 4B, and 4C show plots of normalized peak intensity as a function of temperature for the Si {100} sample. FIG. 4A shows a plot for a (400) Kikuchi line $R^2$=0.986, FIG. 4B shows a plot for (131) $R^2$=0.977, and FIG. 4C shows a plot for (220) $R^2$=0.902. Kikuchi lines from the silicon {100} sample (blue diamonds) can be calculated from Debye Waller factor (red curve). The peak intensity in FIG. 4A was defined as the excess (400) Kikuchi line position determined by the linear scans as shown in FIGS. 1 and 3. From FIG. 4A, it is noted that the normalized peak intensity decreased by about 5% as the temperature increased from 23° C. to 317° C., corresponding to an average decrease of 0.018% per degree.

Carbon deposition was observed when the electron beam was focused on the same spot of the sample for the few hours duration of the entire heating and cooling process. In order to demonstrate that the normalized peak intensity change was not measurably affected by this carbon deposition but was due exclusively to the TDS, for the data in FIGS. 4A-4C the electron beam was blanked when the EBSD patterns were not being collected and the EBSD patterns for each temperature were collected from a different location on the surface (typical increments in position were about 10 µm). Occasionally, when this corresponded to a significant change in height in the sample location (due to the 70° tilt of the sample), this caused slight shifts in the EBSD pattern, and corresponding slight discontinuities in the measured intensity, as for example arrowed in FIG. 4A. This minor issue can be in principle overcome by careful registration of the precise pattern location using software control. Also, as a control, one entire heating/cooling experiment was performed where the electron beam was always focused on the same spot, and very similar intensity variations to those shown in FIGS. 4A-4C were observed.

The practical temperature resolution of ThSEM may be limited by the electron intensity resolution of the EBSD detector, by the portion of the gray level range of the detector actually employed in measurement of the Kikuchi line intensity variations, by the precision of identification the position of the normalized peak intensity, and/or by the background noise in the detector. The EBSD detector with a 12 bit digital CCD camera provided 4096 levels of intensity measurement. For a (400) Kikuchi line of a Si (100) wafer (20 keV electron beam energy), during heating from 23° C. to 317° C., the original peak intensity decreased from 2762 to 2660 (FIG. 3A). Thus, under these conditions, in principle, a 2.9° C. temperature resolution was obtained. Extraneous effects, such as electron beam current stability, stage drifting, sample contamination, vibration, and electromagnetic interference can also potentially contribute to measurement noise, and inhibit attainment of such a resolution.

The instrument was set so that each EBSD pattern consisted of 20 frames of original pattern and the average of 20 pixels along the Kikuchi line was used as the peak intensity. Increasing the number of frames collected reduces the background noise and thus increases the effective temperature resolution, though it also increases the acquisition time (e.g., on the order of seconds). From examination of multiple patterns such as FIGS. 3A and 3B, temperature changes of conservatively better than 10° C. can be consistently differentiated.

The minus sign in front of the right hand side of Equation (4) above means that $I_{normalized}$ decreases with temperature. In the temperature range in this example, the second term in the parenthesis in Example (4) is an order of magnitude lower than the first term, meaning that the TDS effect dominates the dependence of normalized intensity upon temperature. In order to achieve the best temperature sensitivity, $\partial I_{normalized}/\partial T$ should be maximized. According to Equation (4), better temperature sensitivity is achieved if a Kikuchi line is chosen with higher $I_0$ and higher s (since the second order partial derivatives, $\partial^2 I_{normalized}/\partial T \partial s$ and $\partial^2 I_{normalized}/\partial T \partial I_0$, are calculated to be negative under the experimental conditions employed here).

The angular distribution of backscattered electrons for the sample with a high tilt angle resembles an ellipse with the angle between the long axis and sample normal being approximately the same as the incident angle (70°). In order to maximize $I_0$, a portion of the Kikuchi line in the brightest area in EBSD pattern, that is, the area corresponding to the long axis direction should be chosen for temperature measurement.

Referring to FIGS. 4B and 4C, together with FIG. 4A these plots all exhibit the expected decrease in Kikuchi line intensity with temperature. According to the DWF calculations, the expected normalized peak intensity drop for Si (400), (131), and (220) Kikuchi lines from 23° C. to 317° C. were 6.1%, 4.2% and 3.1%, respectively. The experimental measurements followed the same trend of increasing intensity drop with temperature for increasing Bragg scattering angle. Thus this trend demonstrates the higher temperature sensitivity associated with higher values of s predicted by Equation (4).

Plots such as FIG. 4A can serve (in conjunction with a thermocouple measuring the sample surface temperature) as a reference for absolute temperature calibration under the appropriate set of experimental conditions (beam current, beam voltage, stage-detector geometry, sample materials, etc.). Once calibrated, assuming the experimental condition for the reference sample and the sample of interest are the same, ThSEM can then be used to perform nano-scale absolute temperature measurement and mapping for other silicon samples of interest.

The coefficients of determination $R^2$ for the (131) and (220) Kikuchi line data in FIGS. 4B and 4C are 0.977 and 0.902, respectively, which are significantly lower than $R^2$ for the (400) Kikuchi line data in FIG. 4A. Two factors may contribute to this decrease. Data for (131) and (220) Kikuchi line were extracted from an area of lower signal intensity in the EBSD pattern compared to those for the (400) Kikuchi line, resulting in lower signal to noise ratios. Also, as described earlier, the calculated normalized peak intensity drop for the (131) and (220) Kikuchi lines are 4.2% and 3.1%, respectively, compared to 6.1% for the (400) Kikuchi line, resulting in lower signal differences to detect against noise.

The local temperature rise resulting from beam heating is insignificant in these experiments due to heat dissipation due to radial conduction in the bulk sample. The temperature rise in a stationary probe has been estimated as shown in Equation 5 above. Under the experimental conditions for this example, according to Equation (5), $\Delta T$ for the Si sample was less than 0.1° C.

Figure 5A:
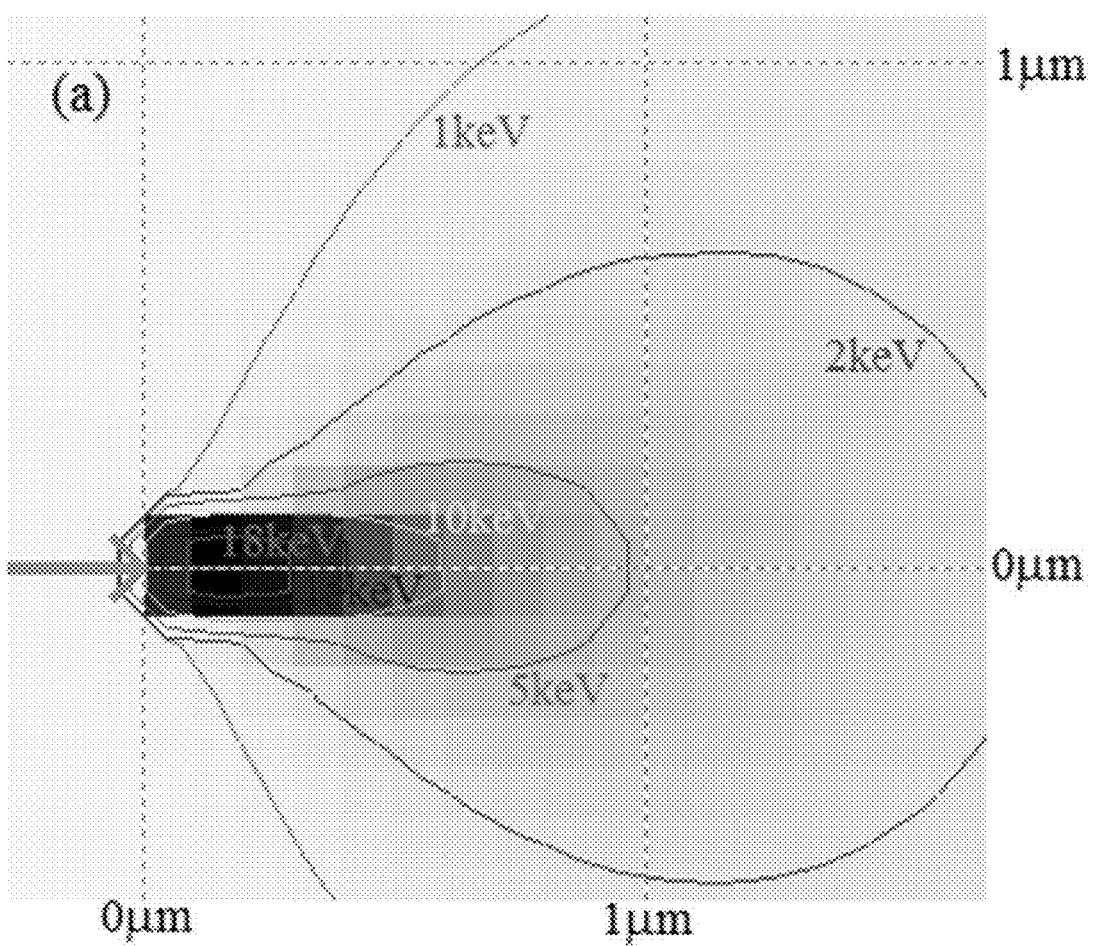
FIG. 5A shows an image of Monte Carlo simulation results.
Figure 5B:
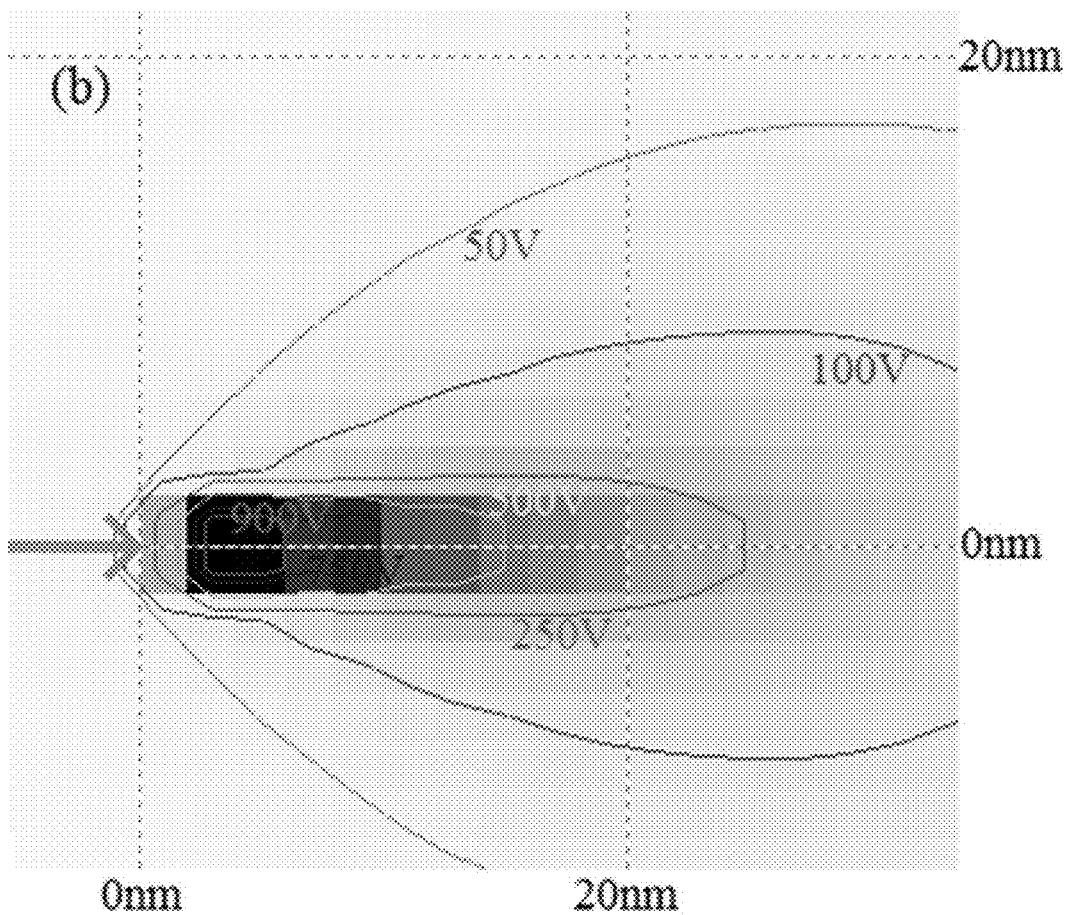
FIG. 5B shows an image of Monte Carlo simulation results.

Monte Carlo simulations (using CASINO V2.42, www.gel.usherbrooke.ca/casino/) of electron-solid interactions were performed. FIGS. 5A and 5B show the Monte Carlo simulation results, viewed along the silicon sample surface normal, of contours for backscattered electrons of different remaining energies after electron—sample interaction. FIG. 5 shows results for an incident electron beam energy of 20 keV and probe size of 10 nm, and FIG. 5B shows results for an incident electron beam energy of 1 keV and probe size of 1 nm. The incident angle of the electron beam (indicated by the orange arrow) was 70° to the sample surface normal. Monte Carlo simulations can be used to assess results of the temperature measurement technique, and the temperature measurement does not require Monte Carlo simulations.

According to the Monte Carlo simulations, the backscattered electrons from a Si sample with a 20 keV incident beam and 70° incident angle have a maximum intensity at around 19 keV; electrons with this energy escape from less than a 80 nm diameter sample surface area. Since the peak intensities along the scan lines across Kikuchi lines were used in this example, the Kikuchi lines used for temperature measurement are from Bragg diffraction of electrons with energy near 19 keV from the top few nanometers layer of the Si sample. As a result, the temperature information obtained from this technique comes from less than an 80 mm diameter area on the surface. Lowering the incident beam voltage can further increase the spatial resolution by decreasing the escape area. With modern field emission SEMs, very low beam energy (down to less than 1 keV) can be obtained with greatly reduced aberrations, decreasing the escape area for electron energies with largest intensity to diameters of a few nanometers. Thus, with a small enough probe size and low enough electron energy, a temperature mapping resolution less than 10 nm can be achieved by ThSEM.

EXAMPLE 2

In order to compare the effects of the above three material dependent factors experimentally, all other relevant factors should be precisely controlled. This requires materials for comparison which differ only in the above factors with all other parameters (especially those relevant to electron diffraction) the same or at least very close to each other. Single crystal Si and Ge {100} samples can be selected for these experiments due to the availability of pure and crysto-graphically perfect samples, their similar electron diffraction related material properties (e.g., the same crysto-graphic structure), but different B-factor sensitivities, atomic numbers, and lattice constants (i.e., the effects of the three factors to be compared).

ThSEM temperature measurements were performed on single crystal silicon {100} and germanium {100} samples. These samples were selected for due to the availability of pure and crysto-graphically perfect (or nearly perfect) samples, their similar electron diffraction related material properties (e.g., the same crysto-graphic structure), but different B-factor sensitivities, atomic numbers, and lattice constants (i.e., the effects of the three factors to be compared).

To ensure constant experimental (hardware) conditions, the column-sample-detector geometry was precisely controlled for both Si and Ge samples so that the Kikuchi lines and zone axes for the Si and Ge samples were kept very close to the same position with respect to the detector. Kikuchi lines with the same index were compared from the two samples. Moreover, the probe current was kept close to the same value (~1 µA in this example) for both sets of measurements. Carbon deposition was observed when the electron beam was focused on the same spot of the sample for the few hours duration of the entire heating/cooling process. In order to rule out possible effects of such deposition on the normalized peak intensity, the EBSD pattern for each temperature was collected from a different location on the surface (typical increments in position were about 10 µm) so that the same amount of carbon deposition was built up for each measurement.

Figure 7:
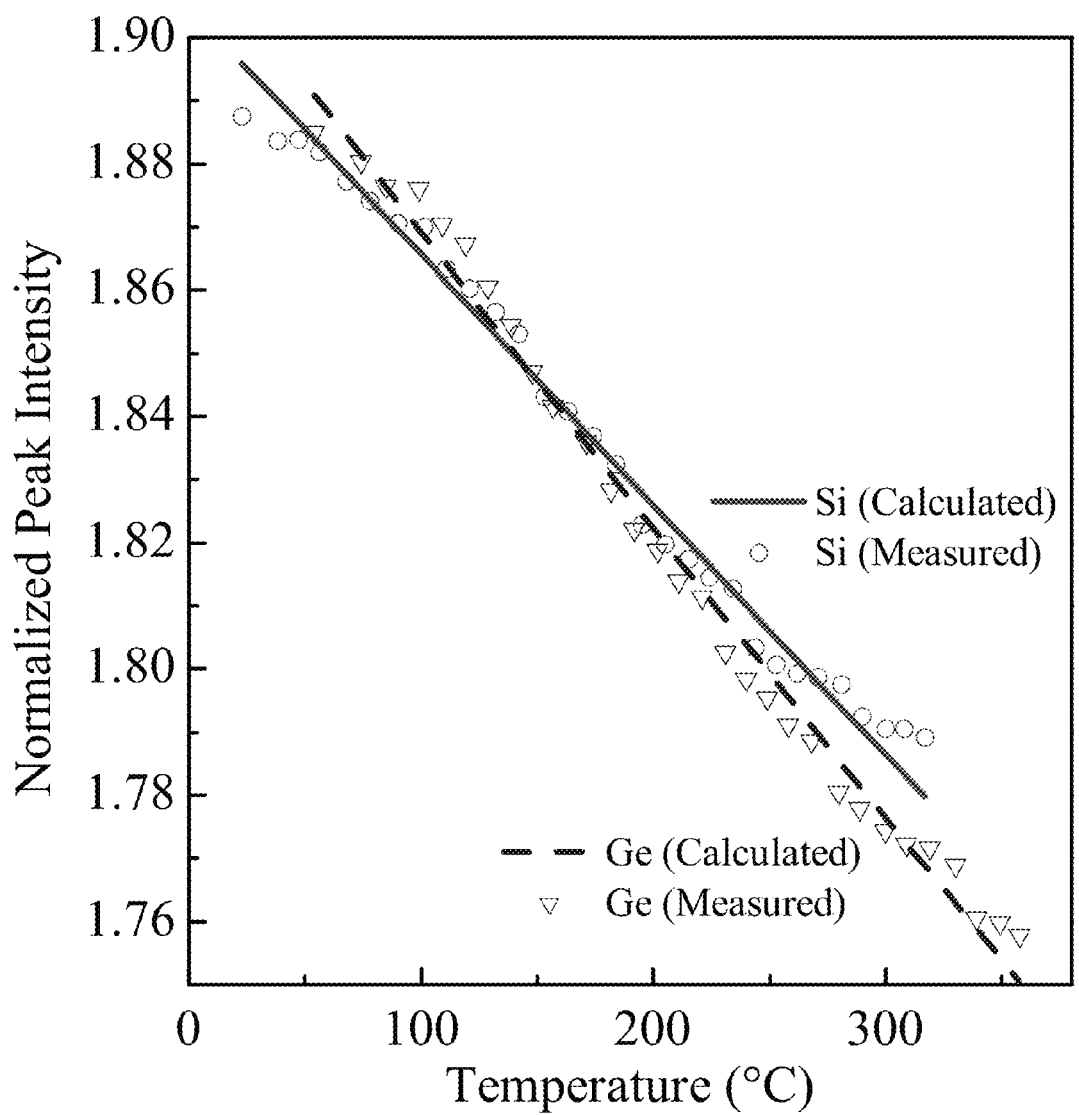
FIG. 7 shows a plot of normalized peak intensity as a function of temperature for silicon and germanium samples.

EBSD patterns were collected for both Si and Ge, and the normalized peak intensity was extracted according to the procedure discussed herein. FIG. 1A shows an image of an EBSD pattern of the Si sample, and FIG. 1B shows an image of a scan line location across a Kikuchi line for the Si sample. FIG. 1C shows an image of an EBSD pattern of the Ge sample, and FIG. 1D shows an image of a scan line location across a Kikuchi line for the Ge sample. FIG. 7 shows a plot of normalized peak intensity as a function of temperature for both Si (calculated—red line, measured—circles) and Ge (calculated—blue line, measured—triangles).

Referring to FIG. 7, the circles and triangles show the dependence of normalized peak intensity upon temperature from (400) Kikuchi lines for the Si {100} and Ge {100} samples, respectively. The Si normalized peak intensity drops by 5.5% from 1.887 to 1.789 as the temperature increases from 23° C. to 317° C., corresponding to a temperature dependence of 0.019%/° C., while the Ge intensity decreases by 6.7% from 1.885 to 1.758 as the temperature rises from 54° C. to 358° C., corresponding to a temperature dependence of 0.022%/° C. The temperature sensitivity of Ge is thus about 16% higher than that of Si.

In order to obtain the theoretical normalized peak intensity, the calculated DWF was scaled to the measured data by a scaling factor (C) according to Equation (3) above. This scaling factor was determined by maximizing the coefficient of determination $R^2$. Since B is a function of temperature, according to Equation (3), $I_{normalized}$ is also a function of temperature. The red and blue curves in FIG. 7 depict the relation between the calculated $I_{normalized}$ and temperature. According to Equation (3), temperature is only expressed in the exponential term which is reflected by the slopes of the curves in FIG. 7. By comparing the slope of the experimental data for each material with the corresponding analytical curve from DWF, they agree with each other very well ($R^2$=0.986 for Si and $R^2$=0.990 for Ge), meaning that the normalized peak intensity change is consistent with the calculation from the thermal diffuse scattering theory, and the inherent temperature sensitivity of Ge is higher than that of Si based on the established thermal diffuse scattering theory.

According to the calculation from the parameters obtained from inelastic neutron scattering, the B-factor temperature sensitivity of Ge at 300 K is about 30% higher than that of Si.

According to the previous analysis, B-factor sensitivity increases the sensitivity of temperature measurement. This partially explains the higher temperature sensitivity of Ge than that of Si in the measured data. The higher atomic number of Ge (32 for Ge vs. 14 for Si) also contributes to the higher temperature sensitivity in this experiment. The lattice constant for silicon and germanium is 0.543 nm and 0.565 nm, respectively. If other parameters were the same, Ge would have a lower temperature sensitivity than Si. However, since the lattice constants of Si and Ge are very close to each other, the other two factors, the B-factor sensitivity and the backscatter yield, dominate role in the overall temperature sensitivity in the comparison between Si and Ge.

Three material-dependent factors—the temperature sensitivity of the Debye-Waller B-factor, backscatter yield, and lattice constant—were examined to determine the temperature sensitivity for application of ThSEM to different materials. A higher temperature dependence of the B-factor, higher backscatter yield, and a smaller lattice constant contribute to higher temperature sensitivity. The Si and Ge experimental temperature sensitivity data confirm these observations. This approach can be used to estimate the ultimate temperature sensitivity for different materials and serve as a guideline for optimizing the instrumental parameters accordingly for temperature measurement.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof. disclosed herein, and all such combinations are contemplated with the scope of the invention without limitation thereto.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein (including those in the "References" section) are incorporated by reference in their entirety, including all figures and tables, to the extent they are not inconsistent with the explicit teachings of this specification.

References

[1] D. G. Cahill, W. K. Ford, K. E. Goodson, G. D. Mahan, A. Majumdar, H. J. Maris, R. Merlin, and S. R. Phillpot, Journal of Applied Physics 93, 793 (2003).
[2] K. Luo, R. W. Herrick, A. Majumdar, and P. Petroff, Applied Physics Letters 71, 1604 (1997).
[3] A. Majumdar, Microelectronics Reliability 38, 559 (1998).
[4] G. B. M. Fiege, V. Feige, J. C. H. Phang, M. Maywald, S. Gtrlich, and L. J. Balk, Microelectronics Reliability 38, 957 (1998).
[5] M. Igeta, K. Banerjee, G. Wu, C. Hu, and A. Majumdar, IEEE Electron Device Letters 21, 224 (2000).
[6] S. R. Phillpot and A. J. H. McGaughey, Materials Today 8, 20 (2005).
[7] C. C. Williams and H. K. Wickramasinghe, Applied Physics Letters 49, 1587 (1986).
[8] A. Majumdar, J. P. Carrejo, and J. Lai, Applied Physics Letters 62, 2501 (1993).
[9] D. G. Cahill, K. Goodson, and A. Majumdar, Journal of Heat Transfer 124, 223 (2002).
[10] L. Shi, O. Kwon, A. C. Miner, and A. Majumdar, Journal of Microelectromechanical Systems 10, 370 (2001).
[11] N. Kawamoto, M.-S. Wang, X. Wei, D.-M. Tang, Y. Murakami, D. Shindo, M. Mitome, and D. Golberg, Nanotechnology 22, 485707 (2011).
[12] M. Cannaerts, O. Chamirian, K. Maex, and C. Van Haesendonck, Nanotechnology 13, 149 (2002).
[13] S. V Kalinin and N. Balke, Advanced Materials 22, E193 (2010).
[14] F. P. Incropera and D. P. DeWitt, *Fundamentals of Heat and Mass Transfer,* 5th ed. (Wiley, New York, 2002).
[15] C. Meola and G. M. Carlomagno, Measurement Science and Technology 15, R27 (2004).
[16] W. Liu and B. Yang, Sensor Review 27, 298 (2007).
[17] J. L. Fergason, Applied Optics 7, 1729 (1968).
[18] A. Csendes, V. Szekely, and M. Rencz, Microelectronic Engineering 31, 281 (1996).
[19] T. Brintlinger, Y. Qi, K. H. Baloch, D. Goldhaber-Gordon, and J. Cumings, Nano Letters 8, 582 (2008).
[20] X. Wu and R. Hull, Nanotechnology 23, 465707 (2012).
[21] L. Ile and R. Hull, Nanotechnology 23, 205705 (2012).
[22] S. Zaefferer, Ultramicroscopy 107, 254 (2007).
[23] D. P. Field, Microscopy and Microanalysis 11, 52 (2005).
[24] J. Goldstein, D. Newbury, D. Joy, C. Lyman, P. Echlin, E. Lifshin, L. Sawyer, and J. Michael, *Scanning Electron Microscopy and X-Ray Microanalysis,* 3rd ed. (Springer, New York, 2007).
[25] H. X. Gao and L.-M. Peng, Acta Crystallographica Section A 55, 926 (1999).
[26] L. M. Peng, Micron 30, 625 (1999).
[27] E. Betzig and J. K. Trautman, *Science* 257, 189-195 (1992).
[28] Y. De Wilde, F. Formanek, R. Carminati, B. Gralak, P. A. Lemoine, K. Joulain, J. P. Mulet, Y. Chen, and J. J. Greffet, *Nature* 444, 740-743 (2006).
[29] Y. Nakayama, P. J. Pauzauskie, A. Radenovic, R. M. Onorato, R. J. Saykally, J. Liphardt, and P. Yang, *Nature* 447, 1098-1101 (2007).
[30] Y. D. Suh and R. Zenobi, *Advanced Materials* 12, 1139-1142 (2000).
[31] S. W. Allison, G. T. Gillies, A. J. Rondinone, and M. R. Cates, *Nanotechnology* 14, 859-863 (2003).
[32] C. D. S. Brites, P. P. Lima, N. J. O. Silva, A. Millán, V. S. Amaral, F. Palacio, and L. D. Carlos, *Advanced materials* 22, 4499-504 (2010).
[33] L. Reimer, *Scanning Electron Microscopy: Physics of Image Formation and Microanalysis* 1st ed., Berlin Heidelberg New York Tokyo: Springer-Verlag (1985).
[34] X. Wu and R. Hull, The material dependence of temperature measurement resolution in thermal scanning electron microscopy, *Applied Physics Letters* 102, 113107 (2013).

We claim:

1. A computer-readable medium having computer-executable instructions for performing a method comprising:
    initiating an electron beam of a scanning electron microscope (SEM) to interact with a sample;
    collecting a temperature sensitive signal from the sample using an electron backscatter diffraction (EBSD) detector after initiating the electron beam; and
    analyzing the temperature sensitive signal to determine a temperature of the sample.

2. The computer-readable medium according to claim 1, wherein analyzing the temperature sensitive signal to determine a temperature of the sample comprises analyzing the temperature sensitive signal to determine a relative temperature of the sample, an absolute temperature of the sample, or both.

3. The computer-readable medium according to claim 1, wherein collecting the temperature sensitive signal comprises collecting at least one EBSD pattern.

4. The computer-readable medium according to claim 1, wherein the temperature sensitive signal is generated by electron thermal diffuse scattering or phonon scattering.

5. The computer-readable medium according to claim 1, wherein collecting the temperature sensitive signal comprises collecting at least one EBSD pattern from each location of a plurality of locations on the sample, and
wherein analyzing the temperature sensitive signal comprises analyzing the EBSD patterns and determining the temperature distribution of the sample.

6. The computer-readable medium according to claim 1, wherein the spatial resolution of the temperature determination is no more than 10 μm, and wherein the temperature resolution of the temperature determination is no more than 25° C.

7. The computer-readable medium according to claim 1, wherein the spatial resolution of the temperature determination is no more than 100 nm, and wherein the temperature resolution of the temperature determination is no more than 10° C.

8. The computer-readable medium according to claim 1, wherein the SEM does not make physical contact with a region of the sample from which the temperature sensitive signal is collected.

9. The computer-readable medium according to claim 1, wherein the method further comprises performing a calibration process,
wherein analyzing the temperature sensitive signal comprises comparing the temperature sensitive signal to calibration data obtained during the calibration process to determine the temperature of the sample, and
wherein the calibration process comprises obtaining calibration temperature sensitive signals from the sample at multiple predetermined temperatures.

10. A method of measuring a temperature of a sample, comprising:
initiating an electron beam of a scanning electron microscope (SEM) to interact with the sample;
obtaining a temperature sensitive signal from the sample using an electron backscatter diffraction (EBSD) detector after the interaction with the sample; and
analyzing the temperature sensitive signal to determine a temperature of the sample,
wherein the temperature determination has a high spatial resolution, and
wherein no physical contact is made, during the initiation of the electron beam or while the temperature sensitive signal is obtained, between the SEM and a region of the sample from where the temperature sensitive signal is obtained.

11. The method according to claim 10, wherein analyzing the temperature sensitive signal to determine a temperature of the sample comprises analyzing the temperature sensitive signal to determine a relative temperature of the sample, an absolute temperature of the sample, or both.

12. The method according to claim 10, wherein obtaining the temperature sensitive signal comprises collecting at least one EBSD pattern.

13. The method according to claim 12, wherein analyzing the temperature sensitive signal comprises analyzing the intensity of at least one Kikuchi line.

14. The method according to claim 10, wherein the temperature sensitive signal is generated by electron thermal diffuse scattering or phonon scattering.

15. The method according to claim 10, wherein the spatial resolution of the temperature determination is no more than 10 μm, and wherein the temperature resolution of the temperature determination is no more than 25° C.

16. The method according to claim 10, wherein the spatial resolution of the temperature determination is no more than 100 nm, and wherein the temperature resolution of the temperature determination is no more than 10° C.

17. The method according to claim 10, wherein obtaining the temperature sensitive signal comprises collecting at least one EBSD pattern from each location of a plurality of locations on the sample, and
wherein analyzing the temperature sensitive signal comprises analyzing the EBSD patterns and determining the temperature distribution of the sample.

18. The method according to claim 10, further comprising performing a calibration process,
wherein analyzing the temperature sensitive signal comprises comparing the temperature sensitive signal to calibration data obtained during the calibration process to determine the temperature of the sample, and
wherein the calibration process comprises obtaining calibration temperature sensitive signals from the sample at multiple temperatures.

19. The method according to claim 10, wherein obtaining the temperature sensitive signal comprises using an energy filtering mechanism to select backscatter electrons having an energy within a predetermined energy range to form an EBSD pattern.

20. The method according to claim 12, wherein analyzing the temperature sensitive signal comprises normalizing the at least one EBSD pattern by a mean intensity of the at least one EBSD pattern to eliminate temperature sensitive signals from sources other than thermal diffuse scattering and phonon scattering.

* * * * *

UNITED STATES PATENT AND TRADEMARK OFFICE
CERTIFICATE OF CORRECTION

PATENT NO. : 8,809,783 B2
APPLICATION NO. : 13/920868
DATED : August 19, 2014
INVENTOR(S) : Xiaowei Wu and Robert Hull It is certified that error appears in the above-identified patent and that said Letters Patent is hereby corrected as shown below:

In the Specification

Column 3,
Line 10, "a simplified foam that are" should read --a simplified form that are--.

Column 10,
Line 6, "only the pre actor in (3)" should read --only the prefactor in (3)--.

Column 17,
Line 42, "that an 80 mm diameter area" should read --than an 80 nm diameter area--.

Column 19,
Lines 37-38, "embodiment thereof. disclosed" should read --embodiment thereof disclosed--.

Column 20,
Line 20, "V. Szekely" should read --V. Székely--.

Column 20,
Line 25, "L. Ile and" should read --L. He and--.

Signed and Sealed this
Fourteenth Day of April, 2015

Michelle K. Lee
*Director of the United States Patent and Trademark Office*